(12) United States Patent
Ina et al.

(10) Patent No.: US 12,563,847 B2
(45) Date of Patent: Feb. 24, 2026

(54) APPARATUS AND CONTROL METHOD FOR APPARATUS

(71) Applicant: CANON KABUSHIKI KAISHA, Tokyo (JP)

(72) Inventors: Masao Ina, Kanagawa (JP); Masato Ofuji, Gunma (JP); Takamasa Ishii, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 18/488,873

(22) Filed: Oct. 17, 2023

(65) Prior Publication Data

US 2024/0136385 A1 Apr. 25, 2024
US 2024/0234474 A9 Jul. 11, 2024

(30) Foreign Application Priority Data

Oct. 24, 2022 (JP) ................................. 2022-169667

(51) Int. Cl.
| | |
|---|---|
| *H10F 39/18* | (2025.01) |
| *A61B 6/00* | (2024.01) |
| *H04N 25/30* | (2023.01) |
| *H04N 25/63* | (2023.01) |
| *H04N 25/677* | (2023.01) |
| *H10F 39/00* | (2025.01) |

(52) U.S. Cl.
CPC ......... *H10F 39/1898* (2025.01); *H04N 25/30* (2023.01); *H04N 25/677* (2023.01); *H10F*

*39/802* (2025.01); *H10F 39/8037* (2025.01); *H10F 39/8057* (2025.01)

(58) Field of Classification Search
CPC .............. H10F 39/1898; H10F 39/802; H10F 39/8037; H10F 39/8057; H10F 39/189; H04N 25/30; H04N 25/677; H04N 5/32; H04N 25/63; G01T 1/20184; A61B 6/54
See application file for complete search history.

(56) References Cited

U.S. PATENT DOCUMENTS

| | | | |
|---|---|---|---|
| 2007/0040099 A1* | 2/2007 | Yokoyama ............ | H10F 39/803 |
| | | | 257/E31.066 |
| 2023/0353899 A1* | 11/2023 | Funabashi ............... | H10F 39/12 |

FOREIGN PATENT DOCUMENTS

| | | |
|---|---|---|
| JP | 2001056382 A | 2/2001 |
| JP | 2006101394 A | 4/2006 |
| JP | 2009141439 A | 6/2009 |
| JP | 2013164400 A | 8/2013 |

* cited by examiner

*Primary Examiner* — Ahmed A Berhan
(74) *Attorney, Agent, or Firm* — Canon U.S.A., Inc. IP Division

(57) ABSTRACT
An apparatus includes: a first pixel for acquiring an image, the first pixel including a first conversion element and a first thin-film transistor and connected to a first signal line; and a second pixel for correcting an output of the first pixel, the second pixel including an element and a second thin-film transistor and connected to a second signal line, in which a ratio between a plurality of capacitances related to the first signal line and a ratio between a plurality of capacitances related to the second signal line are approximately equivalent.

20 Claims, 16 Drawing Sheets

Figure 1:
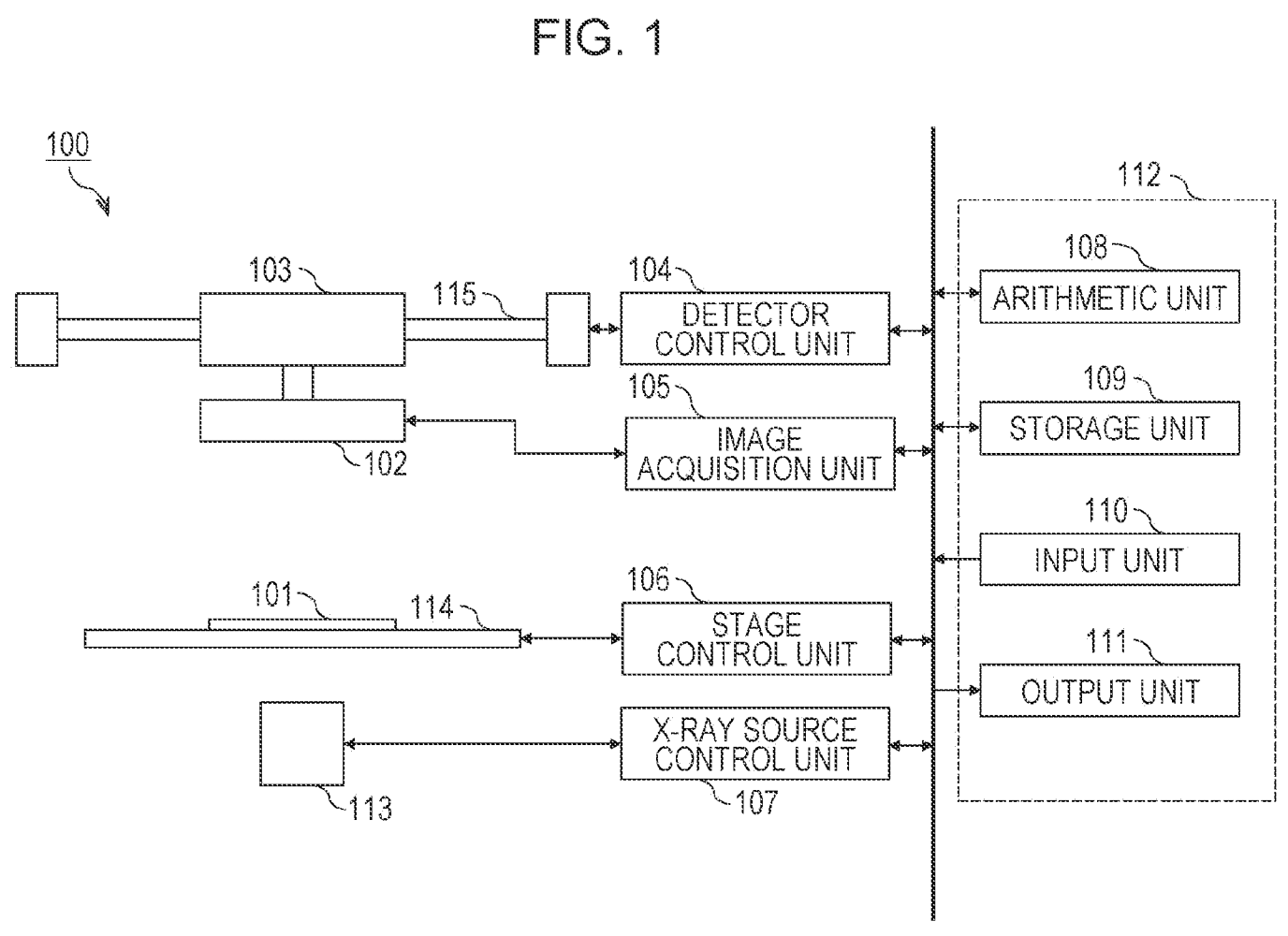

104 DETECTOR CONTROL UNIT

105 IMAGE ACQUISITION UNIT

106 STAGE CONTROL UNIT

107 X-RAY SOURCE CONTROL UNIT

112

108 ARITHMETIC UNIT

109 STORAGE UNIT

110 INPUT UNIT

111 OUTPUT UNIT

FIG. 16A
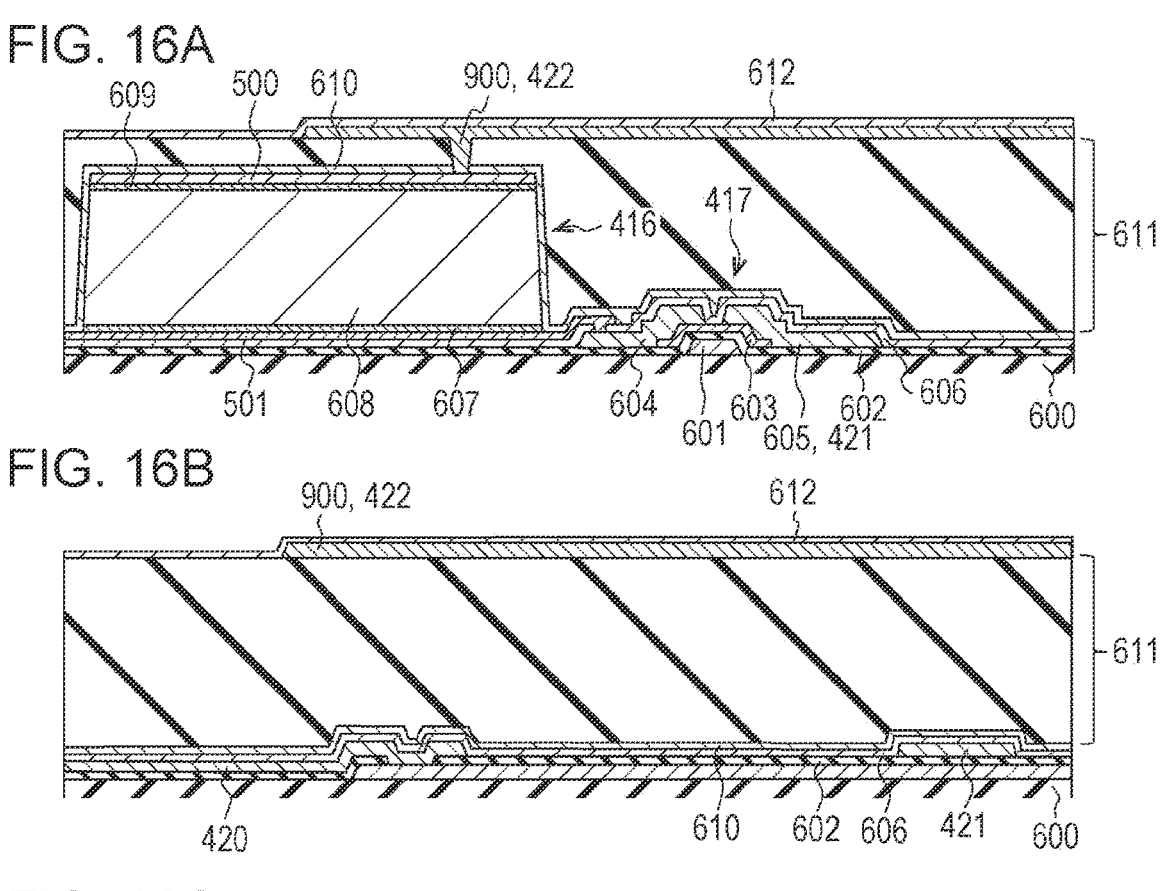
FIG. 16B
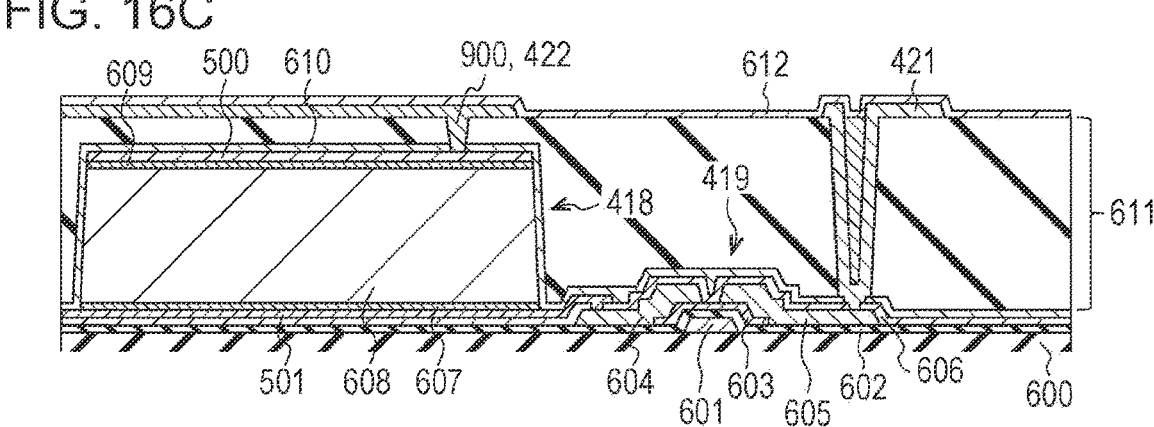
FIG. 16C
FIG. 16D
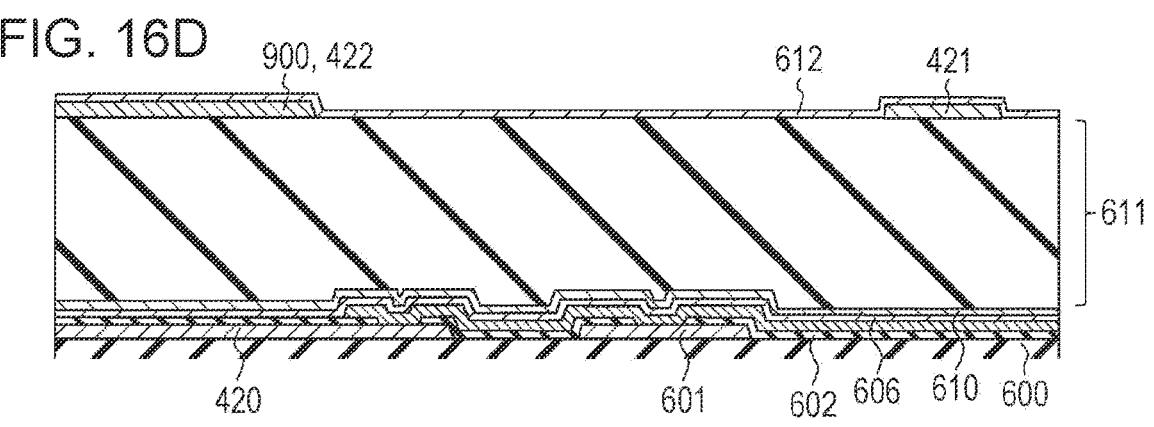

APPARATUS AND CONTROL METHOD FOR APPARATUS

BACKGROUND

Technical Field

The aspect of the embodiments relates to a radiation imaging apparatus and a control method for a radiation imaging apparatus.

Description of the Related Art

As a radiation imaging apparatus for medical imaging diagnosis and nondestructive testing using radiation, a radiation imaging apparatus in which a matrix substrate including a pixel array that is a combination of switches, such as thin-film transistors (TFTs), and conversion elements, such as photoelectric conversion elements, is combined with a scintillator has been put to practical use. For AXI or the like used in angiography in medical imaging diagnosis or nondestructive testing, a high frame rate is required, and such a high frame rate can be attained by using TFTs formed of IGZO or p-Si. However, operations at a high frame rate increases line noise caused by fluctuations in the supply voltage. As a method for correcting line noise, Japanese Patent Laid-Open No. 2009-141439 discloses a correction method using a capacitive element provided outside pixels.

According to Japanese Patent Laid-Open No. 2009-141439, the degree of effect of line noise differs between effective pixels used in image acquisition and the capacitive element, and therefore, correction of line noise with high accuracy leaves room for improvement.

SUMMARY OF INVENTION

The disclosure provides an apparatus including: a first pixel for acquiring an image, the first pixel including a first conversion element and a first thin-film transistor and connected to a first signal line; and a second pixel for correcting an output of the first pixel, the second pixel including an element and a second thin-film transistor and connected to a second signal line, in which a ratio between a plurality of capacitances related to the first signal line and a ratio between a plurality of capacitances related to the second signal line are approximately equivalent.

Further features of the disclosure will become apparent from the following description of exemplary embodiments with reference to the attached drawings.

BRIEF DESCRIPTION OF THE DRAWINGS

FIG. 1 is a diagram illustrating an example configuration of an X-ray inspection apparatus.

FIGS. 5A and 5B are plan views of pixels of the X-ray detector.

FIG. 11 is a detailed diagram of the sensor substrate of the X-ray detector.

FIGS. 16A to 16D are cross-sectional views of the pixels of the X-ray detector.

DESCRIPTION OF THE EMBODIMENTS

Figure 2:
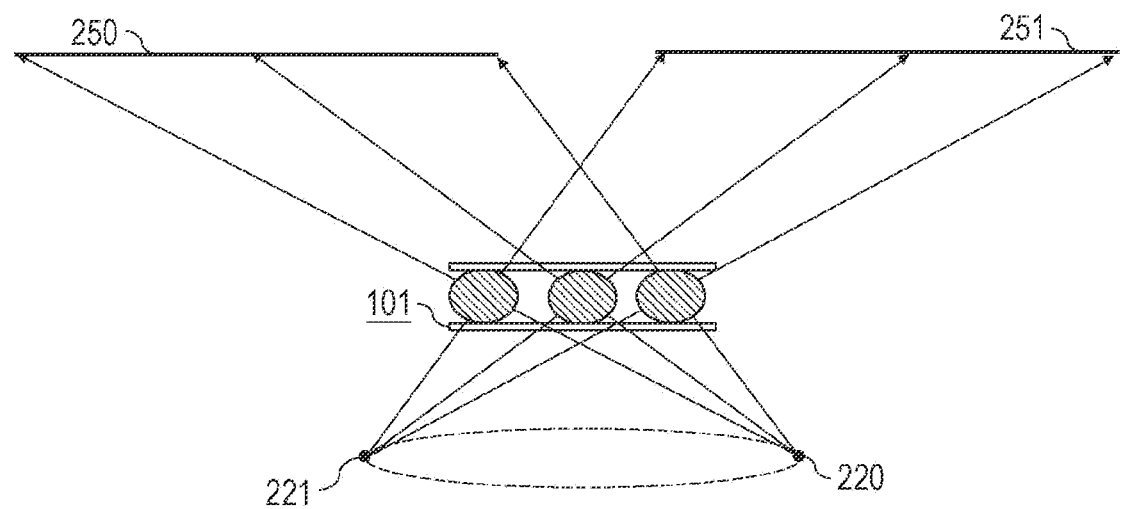
FIG. 2 is a diagram illustrating an imaging method using the X-ray inspection apparatus.

Hereinafter, embodiments will be described in detail with reference to the drawings. In the following embodiments, a case where an X-ray inspection apparatus that obtains X-ray image data of subjects by using X-rays is applied as a radiation imaging apparatus will be described. The embodiments are applicable not only to this X-ray inspection apparatus but also to, for example, a radiation imaging apparatus that captures radiological images of subjects by using radiation, such as a rays.

First Embodiment

FIG. 1 is a diagram illustrating an example configuration of an X-ray inspection apparatus 100 according to a first embodiment. The X-ray inspection apparatus 100 includes a control device 112, an X-ray source 113, a stage 114, an X-ray detector 102, a detector support 103, and a 2-axis robot arm 115 of orthogonal type. The X-ray inspection apparatus 100 further includes a detector control unit 104, an image acquisition unit 105, a stage control unit 106, and an X-ray source control unit 107. The control device 112 includes an arithmetic unit 108, a storage unit 109, an input unit 110, and an output unit 111. On the stage 114, a subject 101 that is an examination target is placed.

The X-ray source 113 emits X-rays toward the X-ray detector 102 through the subject 101. The X-ray source control unit 107 controls X-ray emission by the X-ray source 113. The stage control unit 106 controls movement of the stage 114. The X-ray detector 102 detects X-rays and generates an image based on the amount of X-rays. The image acquisition unit 105 acquires the image generated by the X-ray detector 102. The detector support 103 supports the X-ray detector 102. The 2-axis robot arm 115 moves the position of the detector support 103. The detector control unit 104 controls the 2-axis robot arm 115.

The control device 112 controls the detector control unit 104, the image acquisition unit 105, the stage control unit 106, and the X-ray source control unit 107. The output unit 111 is, for example, a display unit, and displays images and information. The input unit 110 includes, for example, an input operator and a keyboard to input various types of information. The storage unit 109 stores programs, images, data, and so on. The arithmetic unit 108 executes programs stored in the storage unit 109 to thereby perform various calculations and control.

FIG. 2 is a diagram illustrating relative positional relationships between the X-ray source 113, the subject 101, and the X-ray detector 102. In one aspect, the positional relationship between the X-ray source 113, the subject 101, and the X-ray detector 102 is defined by, for example, an X-ray focal position 220, the subject 101, and a position 250 of the X-ray detector 102. At this time, X-rays emitted from the X-ray source 113 are output from the X-ray focal position 220, pass through the subject 101, and are detected by the X-ray detector 102 located at the position 250. In another aspect, when the X-ray source 113 is located at an X-ray focal position 221, X-rays emitted from the X-ray source 113 pass through the subject 101 and are detected by the X-ray detector 102 located at a position 251. To acquire a reconstructed image of a tomographic image of the subject, imaging is performed while the positional relationship between the X-ray source 113, the subject 101, and the X-ray detector 102 is thus changed.

Figure 3:
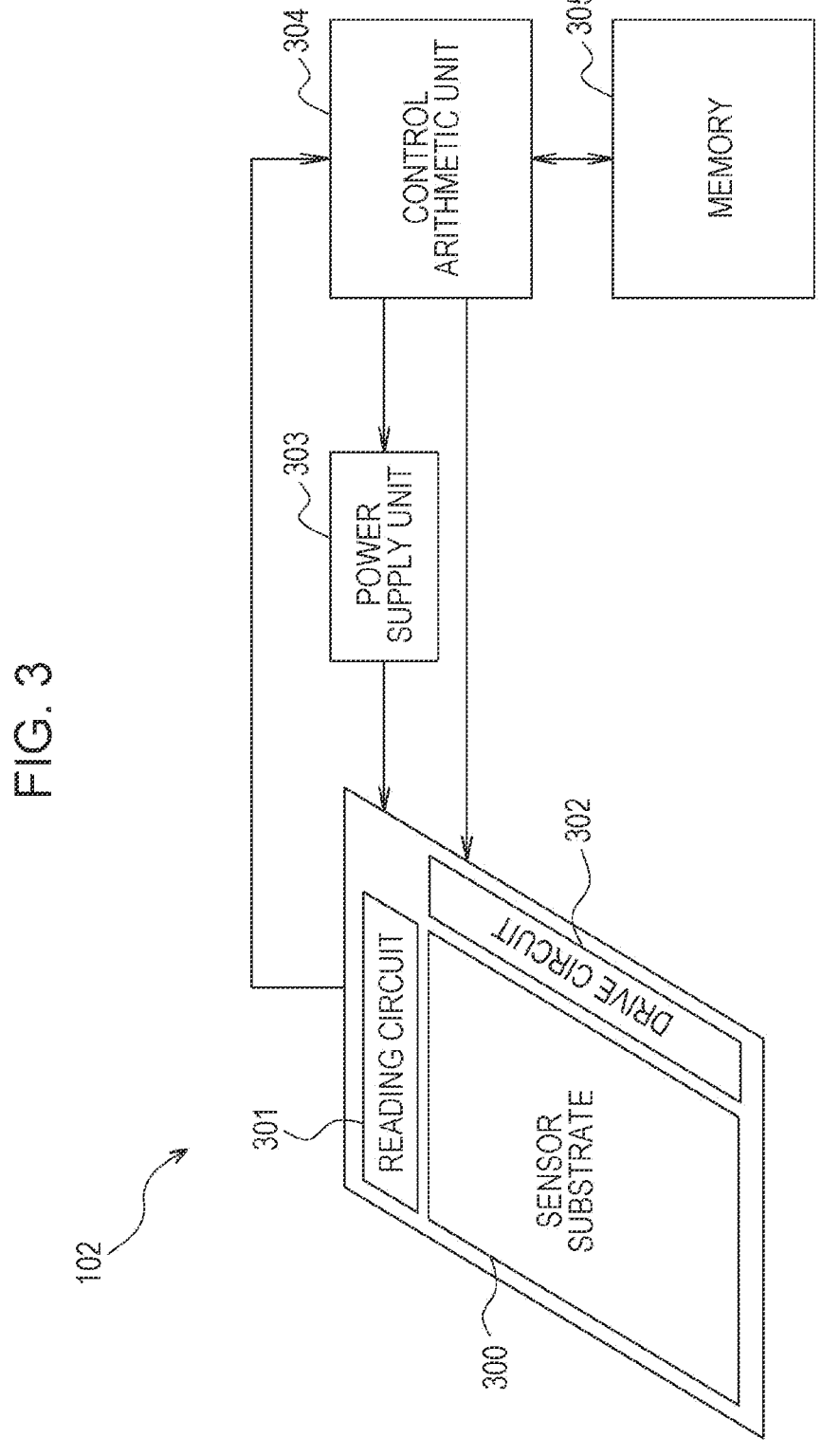
FIG. 3 is a diagram illustrating an example configuration of an X-ray detector.

FIG. 3 is a diagram illustrating an example configuration of the X-ray detector 102 in FIG. 1. The X-ray detector 102 includes a sensor substrate 300, a reading circuit 301, a drive circuit 302, a power supply unit 303, a control arithmetic unit 304, and a memory 305. The power supply unit 303 supplies a supply voltage to the reading circuit 301 and the drive circuit 302. The sensor substrate 300 is driven by the drive circuit 302. The sensor substrate 300 converts incident X-rays to charge signals. The reading circuit 301 reads the charge signals obtained by conversion by the sensor substrate 300. The control arithmetic unit 304 performs a correction process and so on for the charge signals read by the reading circuit 301 and temporarily saves the charge signals in the memory 305. A scintillator (not illustrated) that converts X-rays to light, such as visible light, is provided so as to face the sensor substrate 300, and the sensor substrate 300 makes signal charges corresponding to the amount of X-rays be generated in photoelectric conversion elements described below.

Figure 4:
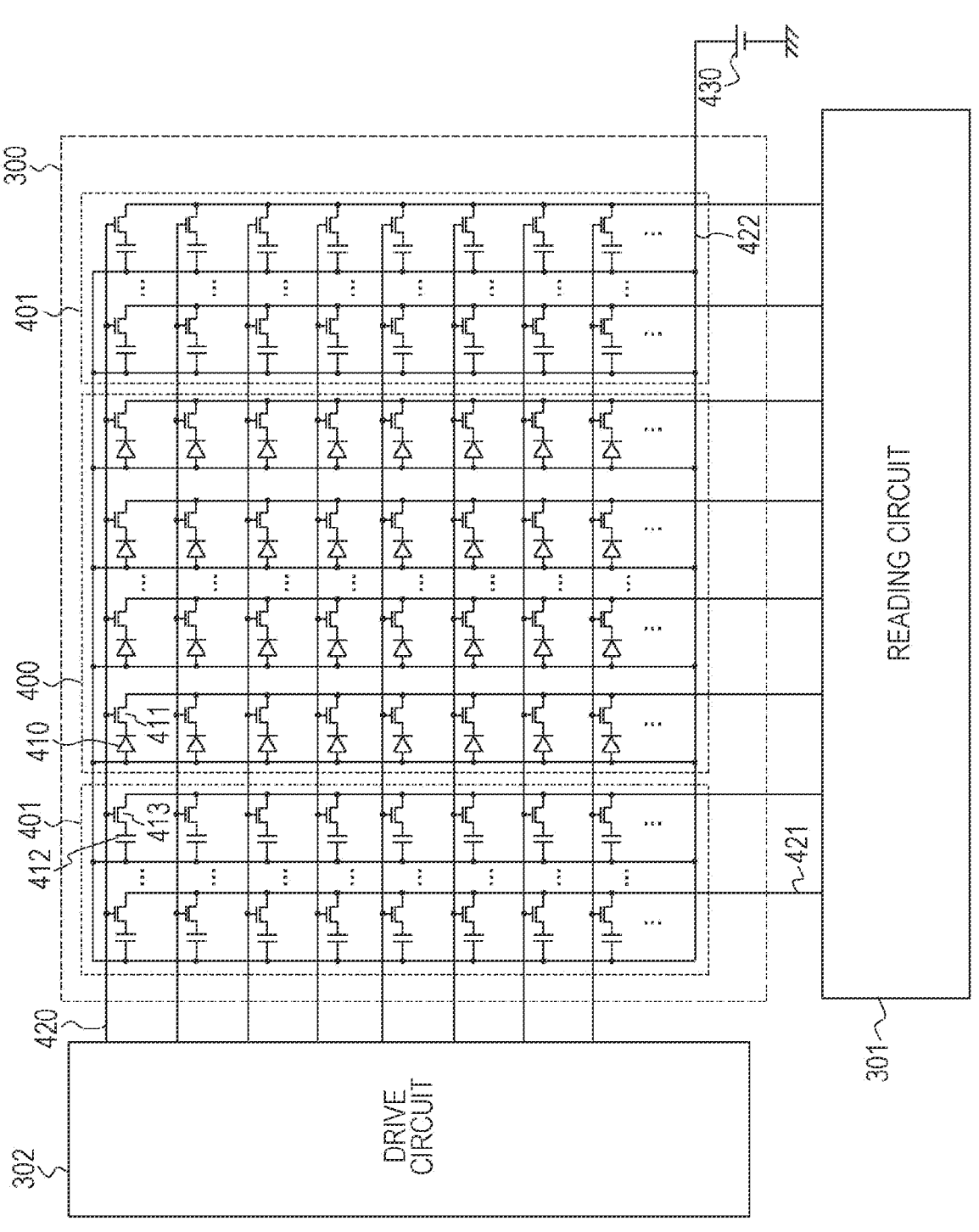
FIG. 4 is a detailed diagram of a sensor substrate of the X-ray detector.

FIG. 4 is a diagram illustrating a relationship between the sensor substrate 300, the reading circuit 301, and the drive circuit 302 in FIG. 3. As the sensor substrate 300, an example equivalent circuit is illustrated. The sensor substrate 300 is created on an insulating substrate, such as a glass substrate, by using a manufacturing process similar to that for liquid crystals. The sensor substrate 300 has an effective pixel region 400 used in image acquisition and a line noise correction pixel region 401 used in line noise correction. The effective pixel region 400 is provided in the center portion of the sensor substrate 300, and the line noise correction pixel region 401 is provided in end portions of the sensor substrate 300. A control method for the X-ray inspection apparatus 100 will be described below.

The effective pixel region 400 includes a plurality of effective pixels, and each of the plurality of effective pixels includes one photoelectric conversion element 410 and one TFT 411. The photoelectric conversion element 410 converts light to an electric charge. The TFT 411 is a thin-film transistor and is a switch element for outputting an electric signal based on the electric charge obtained by conversion by the photoelectric conversion element 410.

The line noise correction pixel region 401 includes a plurality of line noise correction pixels, and each of the plurality of line noise correction pixels includes one capacitive element 412 and one TFT 413. The capacitive element 412 has a capacitance and does not convert light to an electric charge. The TFT 413 is a thin-film transistor and is a switch element for outputting an electric signal based on an electric charge stored in the capacitive element 412.

The effective pixels and the line noise correction pixels are hereinafter collectively referred to as pixels. The plurality of pixels in the effective pixel region 400 and the plurality of pixels in the line noise correction pixel region 401 are arranged on the sensor substrate 300 in a matrix. A plurality of drive lines 420 are each connected in common to the gate electrodes of the TFTs 411 and the TFTs 413 of the plurality of pixels in a corresponding one of the rows. A plurality of signal lines 421 are each connected in common to the drain electrodes of the TFTs 411 and the TFTs 413 of the plurality of pixels in a corresponding one of the columns. A bias line 422 is connected in common to the photoelectric conversion element 410 of each pixel and the capacitive element 412 of each pixel. The photoelectric conversion element 410 is connected between the source electrode of the TFT 411 and the bias line 422. The capacitive element 412 is connected between the source electrode of the TFT 413 and the bias line 422.

The plurality of drive lines 420 are connected to the drive circuit 302. The drive circuit 302 supplies to the plurality of drive lines 420 either a voltage (conduction voltage) for making the TFTs 411 and the TFTs 413 be conductive or a voltage (non-conduction voltage) for making the TFTs 411 and the TFTs 413 be non-conductive. The drive circuit 302 supplies the conduction voltage to any of the plurality of drive lines 420 to thereby make the TFTs 411 and the TFTs 413 output electric signals from the pixels to the signal lines 421 on a row-by-row basis.

The plurality of signal lines 421 are connected to the reading circuit 301. The reading circuit 301 reads in parallel, electric signals from pixels in each column through a corresponding one of the plurality of signal lines 421 on a row-by-row basis.

The bias line 422 is connected to a sensor power supply 430. The sensor power supply 430 supplies through the bias line 422 a voltage Vs for making the photoelectric conversion element 410 be ready for photoelectric conversion.

Figures 5A, 5B:
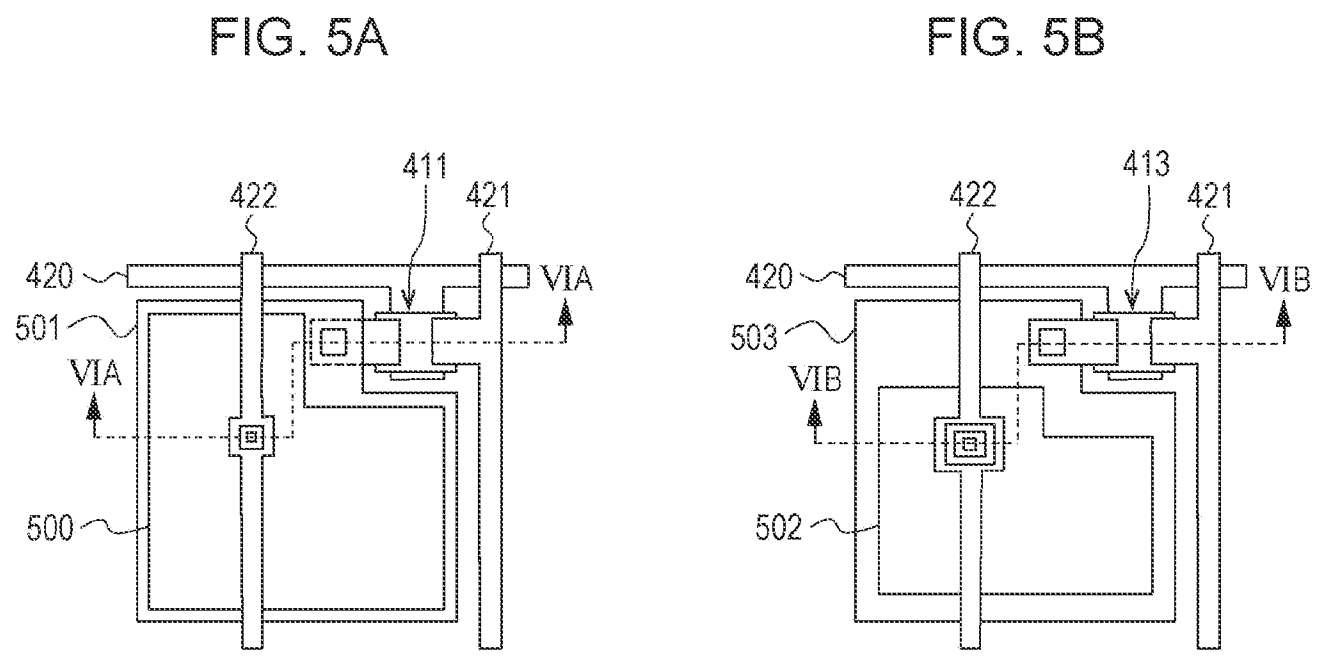

FIG. 5A is a plan view of one effective pixel in the effective pixel region 400 in FIG. 4. The effective pixel includes the photoelectric conversion element 410 and the TFT 411. The photoelectric conversion element 410 includes an upper electrode 500 and a lower electrode 501. The bias line 422 is connected to the upper electrode 500 of the photoelectric conversion element 410 through a contact hole and applies the voltage Vs. In response to incidence of light, the photoelectric conversion element 410 converts the light to an electric charge by photoelectric conversion and stores the electric charge. The lower electrode 501 of the photoelectric conversion element 410 is connected to the source electrode of the TFT 411 through a contact hole. The drive line 420 is connected to the gate electrode of the TFT 411. The signal line 421 is connected to the drain electrode of the TFT 411. In response to application of the conduction voltage to the drive line 420, the TFT 411 becomes conductive and an electric signal is output to the signal line 421 on the basis of the electric charge stored in the photoelectric conversion element 410.

FIG. 5B is a plan view of one line noise correction pixel in the line noise correction pixel region 401 in FIG. 4. The line noise correction pixel includes the capacitive element 412 and the TFT 413.

The capacitive element 412 includes an upper electrode 502 and a lower electrode 503. The bias line 422 is connected to the upper electrode 502 of the capacitive element 412 through a contact hole and applies the voltage Vs. Unlike the photoelectric conversion element 410, the capacitive element 412 does not photoelectrically convert light in response to incidence of the light and does not generate an electric charge. The lower electrode 503 of the capacitive element 412 is connected to the source electrode of the TFT 413 through a contact hole. The drive line 420 is connected to the gate electrode of the TFT 413. The signal line 421 is connected to the drain electrode of the TFT 413. In response to application of the conduction voltage to the drive line 420, the TFT 413 becomes conductive.

Figures 6A, 6B:
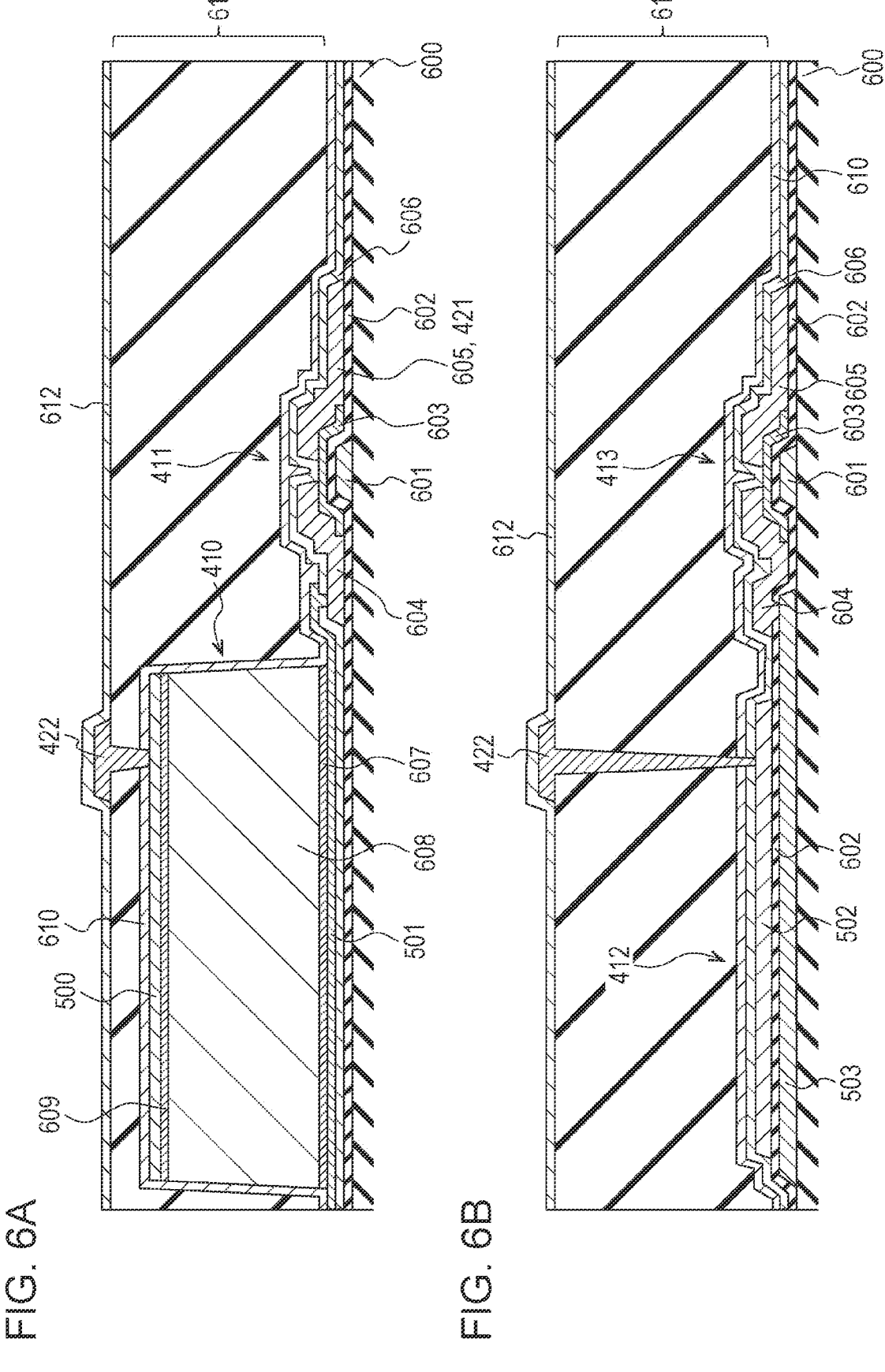
FIGS. 6A and 6B are cross-sectional views of the pixels of the X-ray detector.

FIG. 6A is a cross-sectional view of the effective pixel in FIG. 5A taken along line VIA-VIA. On an insulating substrate 600, each pixel and each element are formed. As the insulating substrate 600, for example, a glass substrate or a plastic substrate may be used. On the insulating substrate 600, the TFT 411 is formed. Although an inverted-staggered TFT is used in this embodiment, for example, a top-gate TFT may be used. The TFT 411 includes a gate electrode 601 formed of a metal layer in the same layer in which the drive line 420 is disposed, an insulating film 602, a semiconductor layer 603, a source electrode 604, and a drain electrode 605 formed of a line the same as the signal line 421. The insulating film 602 functions as a gate insulating film in the TFT 411. On the TFT 411, the photoelectric conversion element 410 is disposed with a protective film 606 interposed therebetween. The photoelectric conversion element 410 has a structure in which a first impurity semiconductor layer 607, an intrinsic semiconductor layer 608, and a second impurity semiconductor layer 609 are stacked in this order between the lower electrode 501 and the upper electrode 500. The first impurity semiconductor layer 607, the intrinsic semiconductor layer 608, and the second impurity semiconductor layer 609 constitute a PIN photodiode to thereby perform photoelectric conversion. Although a PIN photodiode is used as the photoelectric conversion element in this embodiment, for example, an element of MIS type may be used. On the photoelectric conversion element 410, the bias line 422 is disposed with a protective film 610 and an interlayer insulating film 611 interposed therebetween. The effective pixel is covered with a protective film 612.

FIG. 6B is a cross-sectional view of the line noise correction pixel in FIG. 5B taken along line VIB-VIB. The line noise correction pixel includes the capacitive element 412 and the TFT 413. The structure of the TFT 413 is similar to the structure of the TFT 411 in FIG. 6A. In FIG. 6B, the capacitive element 412 is formed instead of the photoelectric conversion element 410 in FIG. 6A. The capacitive element 412 has a structure in which the lower electrode 503, the insulating film 602, and the upper electrode 502 are stacked in this order. The lower electrode 503 is formed of a metal layer in the same layer in which the gate electrode 601 is disposed. The upper electrode 502 is formed of a metal layer in the same layer in which the source electrode 604 and the drain electrode 605 are disposed. Although an example of forming the capacitive element 412 by using the insulating film 602 in order to reduce variations in the capacitance of the capacitive element 412 from a manufacturing process perspective of the sensor substrate 300 has been described as the best form, the capacitive element 412 may be formed by using another insulating film and a metal layer. For example, a capacitive element may be formed by using the upper electrode 502, the bias line 422, the protective film 610, and the interlayer insulating film 611.

Figure 7A:
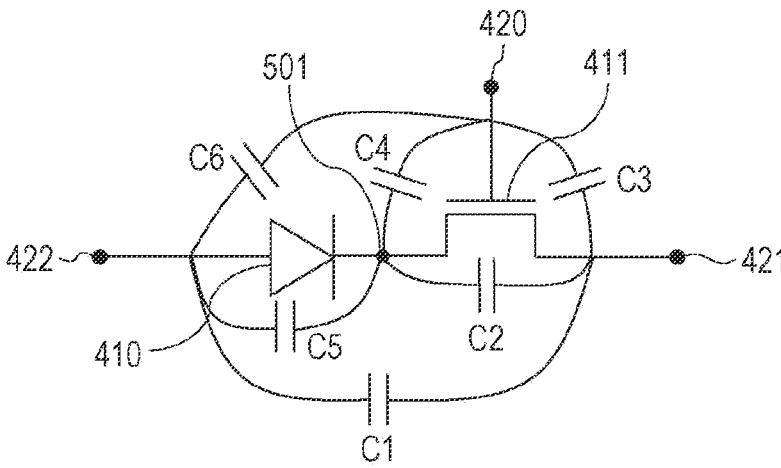
FIGS. 7A and 7B are diagrams illustrating parasitic capacitances in the pixels of the X-ray detector.

Between different metal layers and lines, such as the drive line 420 including the gate electrode 601 and the signal line 421 including the drain electrode 605, a capacitance (parasitic capacitance) is formed across the insulation layer. FIG. 7A illustrates parasitic capacitances generated in the effective pixel in the effective pixel region 400 and the capacitance of the photoelectric conversion element 410. The effective pixel includes the photoelectric conversion element 410 and the TFT 411. Main generated capacitances are six capacitances C1 to C6. The capacitance C1 is a capacitance between the signal line 421 and the bias line 422. The capacitance C2 is a capacitance between the signal line 421 and the lower electrode 501. The capacitance C3 is a capacitance between the signal line 421 and the drive line 420. The capacitance C4 is a capacitance between the drive line 420 and the lower electrode 501. The capacitance C5 is a capacitance between the lower electrode 501 and the bias line 422. The capacitance C6 is a capacitance between the drive line 420 and the bias line 422. Among these, the capacitances C1, C2, and C3 are directly related to the signal line 421, and the capacitances C4, C5, and C6 are indirectly related to the signal line 421.

Figure 7B:
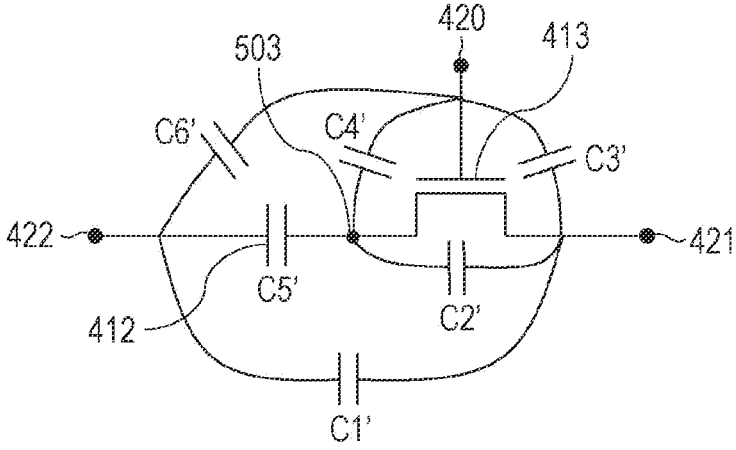

FIG. 7B illustrates parasitic capacitances generated in the line noise correction pixel in the line noise correction pixel region 401 and the capacitance of the capacitive element 412. The line noise correction pixel includes the capacitive element 412 and the TFT 413. Main generated capacitances are six capacitances C1' to C6'. The capacitance C1' is a capacitance between the signal line 421 and the bias line 422. The capacitance C2' is a capacitance between the signal line 421 and the lower electrode 503. The capacitance C3' is a capacitance between the signal line 421 and the drive line 420. The capacitance C4' is a capacitance between the drive line 420 and the lower electrode 503. The capacitance C5' is a capacitance between the lower electrode 503 and the bias line 422. The capacitance C6' is a capacitance between the drive line 420 and the bias line 422. Among these, the capacitances C1', C2', and C3' are directly related to the signal line 421, and the capacitances C4', C5', and C6' are indirectly related to the signal line 421.

In the sensor substrate 300, line noise is generated as follows. Fluctuations in the conduction voltage, the voltage Vs, and/or a reference voltage (ground) are transmitted to the drive line 420 and the bias line 422. This causes fluctuations in the voltages of the drive line 420 and the bias line 422. Voltage fluctuations in the drive line 420 and the bias line 422 propagate to the signal line 421 via the parasitic capacitances C1, C2, C3, C4, C5, and C6. During reading of each row of the sensor substrate 300, such voltage fluctuations in the conduction voltage and so on are superimposed in common on a row-by-row basis, and this leads to line noise. The line noise is corrected on the basis of the fact that the magnitude of line noise superimposed on effective pixels in the effective pixel region 400 in each row of the sensor substrate 300 is equal to the magnitude of line noise superimposed on line noise correction pixels in the line noise correction pixel region 401 in the same row in which the effective pixels are disposed.

The control arithmetic unit 304 in FIG. 3 can correct an output signal of an effective pixel in the effective pixel region 400 by using output signals of line noise correction pixels in the line noise correction pixel region 401 in the same row in which the effective pixel is disposed. For example, the control arithmetic unit 304 subtracts from an output signal of an effective pixel, the average value of output signals of a plurality of line noise correction pixels in the same row in which the effective pixel is disposed to thereby perform line noise correction for the effective pixel. For example, in a case of a first row, the control arithmetic unit 304 subtracts from an output signal of an effective pixel in each column in the first row, the average value of output signals of a plurality of line noise correction pixels in the first row to thereby perform line noise correction for the effective pixel in the column.

To perform line noise correction with high accuracy, the parasitic capacitance ratio C1':C2':C3' of the line noise correction pixel, in one embodiment, is equivalent (within ±30%) to the parasitic capacitance ratio C1:C2:C3 of the effective pixel. To perform correction with higher accuracy, the parasitic capacitance ratio C1':C2':C3':C4':C5':C6' of the line noise correction pixel, in one embodiment, is equivalent to the parasitic capacitance ratio C1:C2:C3:C4:C5:C6 of the effective pixel. The parasitic capacitance ratios may be made equivalent by employing the same structure for the TFT 411 and the TFT 413. Furthermore, the parasitic resistances of respective lines, in one embodiment, are equivalent to make voltage fluctuations in the respective lines caused by fluctuations in the conduction voltage, the voltage Vs, and the reference voltage be equivalent. When line noise is generated in the lengthwise direction, the control arithmetic unit 304 may correct an output signal of an effective pixel by using output signals of line noise correction pixels in the same column in which the effective pixel is disposed.

The parasitic capacitances and the parasitic resistances described above correspond to a parasitic capacitance and a parasitic resistance per pixel formed by the conductor and the insulator of each pixel. The parasitic capacitances and the parasitic resistances can be calculated by using, for example, the finite element method or can be determined by actual measurement.

As described above, the X-ray inspection apparatus 100 is an example of the radiation imaging apparatus. The effective pixel region 400 includes effective pixels used in image acquisition. The effective pixel includes the photoelectric conversion element 410 and the TFT 411. The line noise correction pixel region 401 includes line noise correction pixels. The line noise correction pixel includes the capacitive element 412 and the TFT 413. The structures of the TFT 411 and the TFT 413 are approximately equivalent to each other. The control arithmetic unit 304 functions as a correction unit and corrects signals of the effective pixels by using signals of the line noise correction pixels.

The signal line 421 for the effective pixel region 400 is a signal line for reading signals from the effective pixels. The signal line 421 for the line noise correction pixel region 401 is a signal line for reading signals from the line noise correction pixels. The ratio between the plurality of parasitic capacitances related to the signal line 421 for the effective pixel region 400 in FIG. 7A and the ratio between the plurality of parasitic capacitances related to the signal line 421 for the line noise correction pixel region 401 in FIG. 7B are approximately equivalent to each other. Furthermore, the parasitic resistances of lines in the effective pixel and the parasitic resistances of lines in the line noise correction pixel are approximately equivalent to each other.

In FIG. 4, the plurality of pixels including effective pixels and line noise correction pixels are arranged in a matrix. Line noise correction pixels are disposed in the same row or in the same column in which effective pixels are disposed.

In FIG. 6B, the capacitive element 412 is formed by using the gate insulating film 602 of the TFT 413.

According to this embodiment, the X-ray inspection apparatus 100 can correct line noise generated in the effective pixels by using the line noise correction pixels, with high accuracy.

Second Embodiment

A second embodiment will now be described. The second embodiment is different from the first embodiment in that the sensor substrate 300 further has a light-shielded pixel region 402 in FIG. 8. This allows the control arithmetic unit 304 to correct changes in output signals of the effective pixels in the effective pixel region 400 caused by temperature changes, by using output signals of light-shielded pixels in the light-shielded pixel region 402.

The difference of the second embodiment from the first embodiment will be described below.

Figure 8:
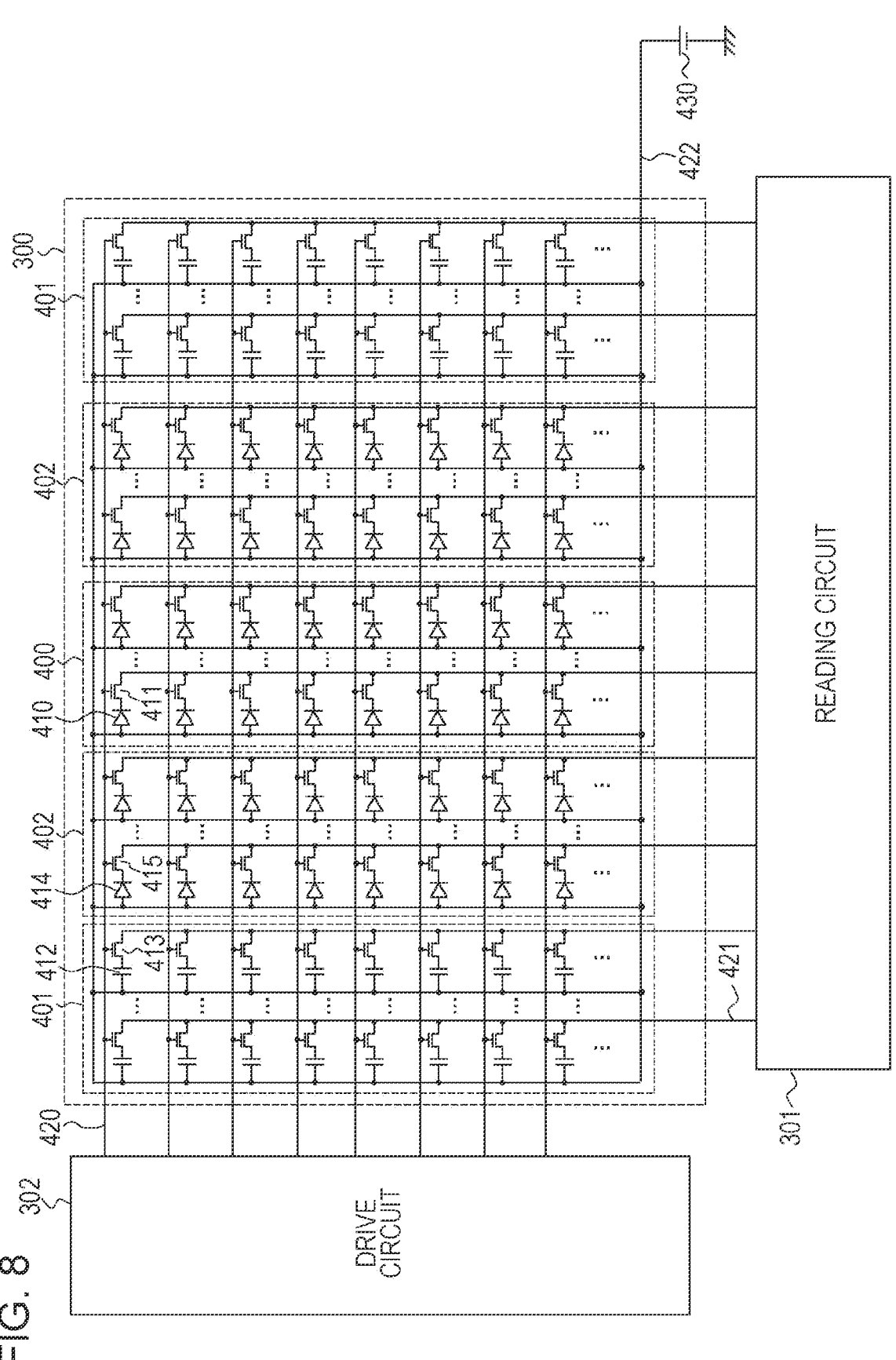
FIG. 8 is a detailed diagram of the sensor substrate of the X-ray detector.

FIG. 8 is a diagram illustrating an example configuration of the sensor substrate 300, the reading circuit 301, the drive circuit 302, and the sensor power supply 430 according to the second embodiment. The sensor substrate 300 has the effective pixel region 400, the line noise correction pixel region 401, and the light-shielded pixel region 402. The effective pixel region 400 and the line noise correction pixel region 401 are similar to those in FIG. 4. The light-shielded pixel region 402 is provided between the effective pixel region 400 and the line noise correction pixel region 401 and is shielded from light. The light-shielded pixel region 402 includes a plurality of light-shielded pixels, and each of the plurality of light-shielded pixels includes one photoelectric conversion element 414 and one TFT 415. The photoelectric conversion element 414 is similar to the photoelectric conversion element 410, and the TFT 415 is similar to the TFT 411. The plurality of pixels in the effective pixel region 400, the line noise correction pixel region 401, and the light-shielded pixel region 402 are arranged on the sensor substrate 300 in a matrix. The plurality of drive lines 420 are each connected in common to the gate electrodes of the TFTs 411, 413 and 415 of the plurality of pixels in a corresponding one of the rows. The plurality of signal lines 421 are each connected in common to the drain electrodes of the TFTs 411, 413 and 415 of the plurality of pixels in a corresponding one of the columns. The bias line 422 is connected in common to the photoelectric conversion element 410 of each pixel, the photoelectric conversion element 414 of each pixel, and the capacitive element 412 of each pixel. The photoelectric conversion element 414 is connected between the source electrode of the TFT 415 and the bias line 422. The light-shielded pixel region 402 is shielded from light, and therefore, no electric charge is generated in the photoelectric conversion element 414 in response to the scintillator converting X-rays to light.

Figure 9:
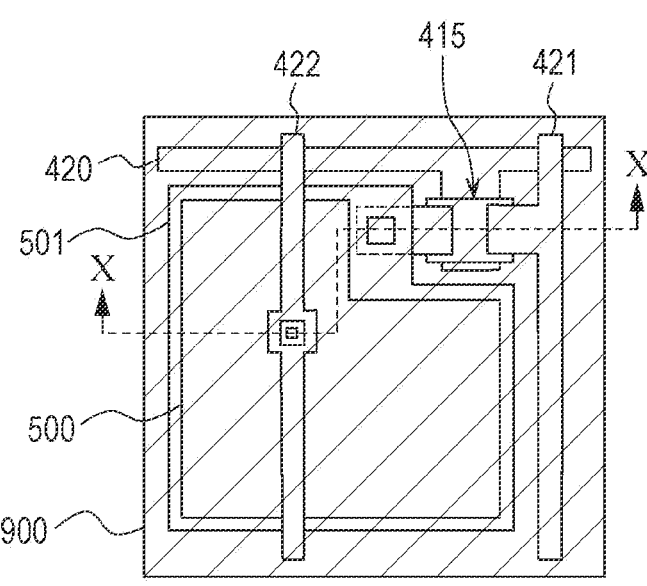
FIG. 9 is a plan view of a pixel of the X-ray detector.

FIG. 9 is a plan view of one light-shielded pixel in the light-shielded pixel region 402 in FIG. 8. The light-shielded pixel includes the photoelectric conversion element 414 and the TFT 415. The structure of the light-shielded pixel in FIG. 9 is similar to the structure of the effective pixel in FIG. 5A. However, the entire light-shielded pixel is shielded from light by a light-shielding layer 900. For the light-shielding layer 900, for example, the bias line 422 can be used as a light-shielding layer.

An example of using the bias line 422 as the light-shielding layer 900 will be described below. Although the light-shielding layer 900 is disposed over the entire light-shielded pixel as the best form to prevent light from incoming, the light-shielding layer 900, in one embodiment, may be disposed over only a portion of the light-shielded pixel. For example, the light-shielding layer 900 may be disposed only over the photoelectric conversion element 414. As the light-shielding layer 900, a layer other than a metal layer may be used. For example, as the light-shielding layer 900, a black matrix may be used.

Figure 10:
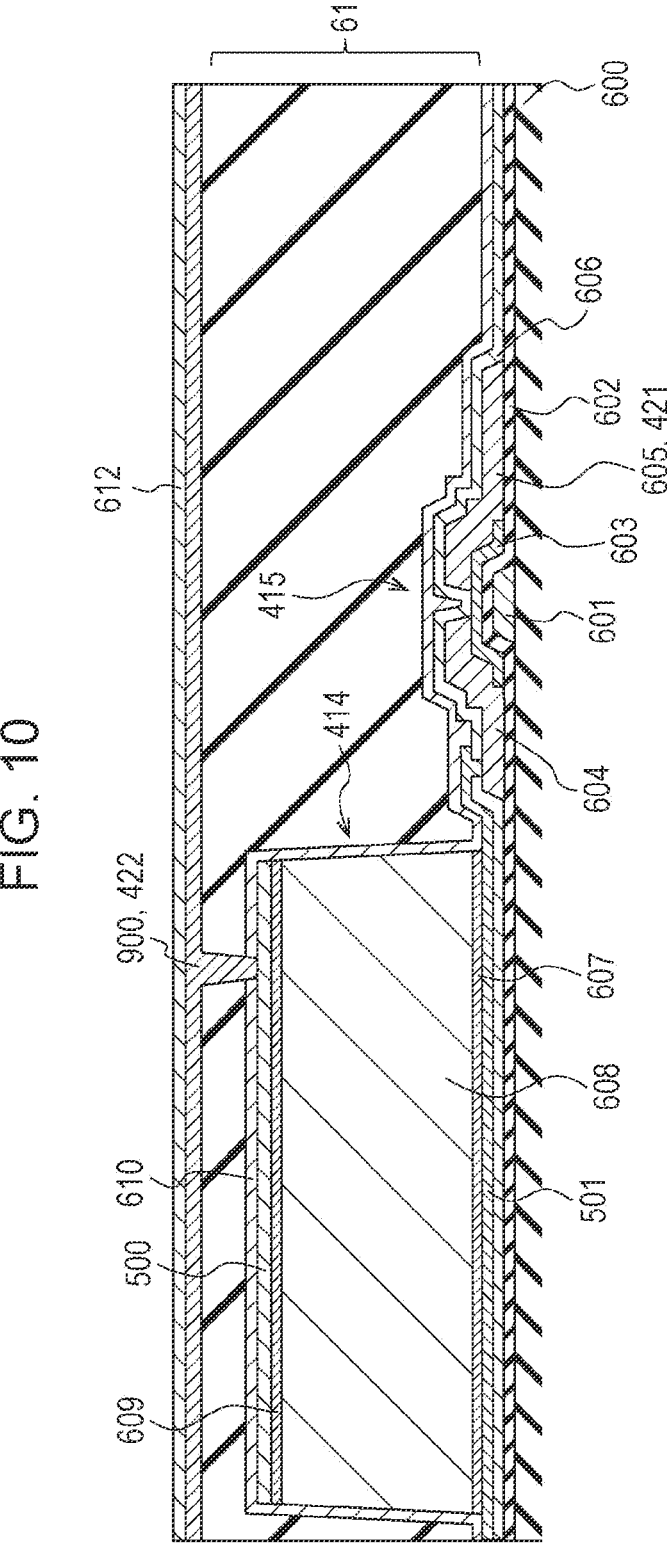
FIG. 10 is a cross-sectional view of the pixel of the X-ray detector.

FIG. 10 is a cross-sectional view of the light-shielded pixel in FIG. 9 taken along line X-X. The light-shielded pixel includes the photoelectric conversion element 414 and the TFT 415. The light-shielded pixel in FIG. 10 is different from the effective pixel in FIG. 6A in that the photoelectric conversion element 414 and the TFT 415 are shielded from light by the bias line 422. The bias line 422 functions as the light-shielding layer 900. No light is incident on the photoelectric conversion element 414, and therefore, the light-shielded pixel outputs dark current components generated in the photoelectric conversion element 414 and the TFT 415. The structure of the photoelectric conversion element 410 and that of the photoelectric conversion element 414 are the same, and the structure of the TFT 411 and that of the TFT 415 are the same. Therefore, the temperature dependence of the dark current can be considered equivalent in the photoelectric conversion elements and in the TFTs (with an error of, for example, within ±10%). This allows the control arithmetic unit 304 in FIG. 3 to correct output signals of the effective pixels in the effective pixel region 400 by using output signals of the light-shielded pixels in the light-shielded pixel region 402 to thereby reduce output changes caused by temperature changes.

The control arithmetic unit 304 can correct an output signal of an effective pixel in the effective pixel region 400 by using output signals of line noise correction pixels in the line noise correction pixel region 401 in the same row in which the effective pixel is disposed and output signals of light-shielded pixels in the light-shielded pixel region 402 in the same row in which the effective pixel is disposed. The control arithmetic unit 304 subtracts from an output signal of an effective pixel, the average value of output signals of a plurality of line noise correction pixels in the same row in which the effective pixel is disposed and further subtracts the average value of output signals of a plurality of light-shielded pixels in the same row in which the effective pixel is disposed to thereby correct line noise and temperature changes. For example, in a case of a first row, the control arithmetic unit 304 subtracts from an output signal of an effective pixel in each column in the first row, the average value of output signals of a plurality of line noise correction pixels in the first row and further subtracts the average value of output signals of a plurality of light-shielded pixels in the first row to thereby perform correction for the effective pixel in the column.

An example in which the effective pixel region 400 and the light-shielded pixel region 402 are adjacent to each other in order to maintain uniformity in the structures of the photoelectric conversion element 410 and the photoelectric conversion element 414 from a manufacturing process perspective of the sensor substrate 300 has been described as the best form. Note that the effective pixel region 400 and the light-shielded pixel region 402 need not be adjacent to each other. For example, when viewed from the drive circuit 302 in FIG. 8, the light-shielded pixel region 402, the line noise correction pixel region 401, and the effective pixel region 400 may be disposed in this order.

Figure 11:
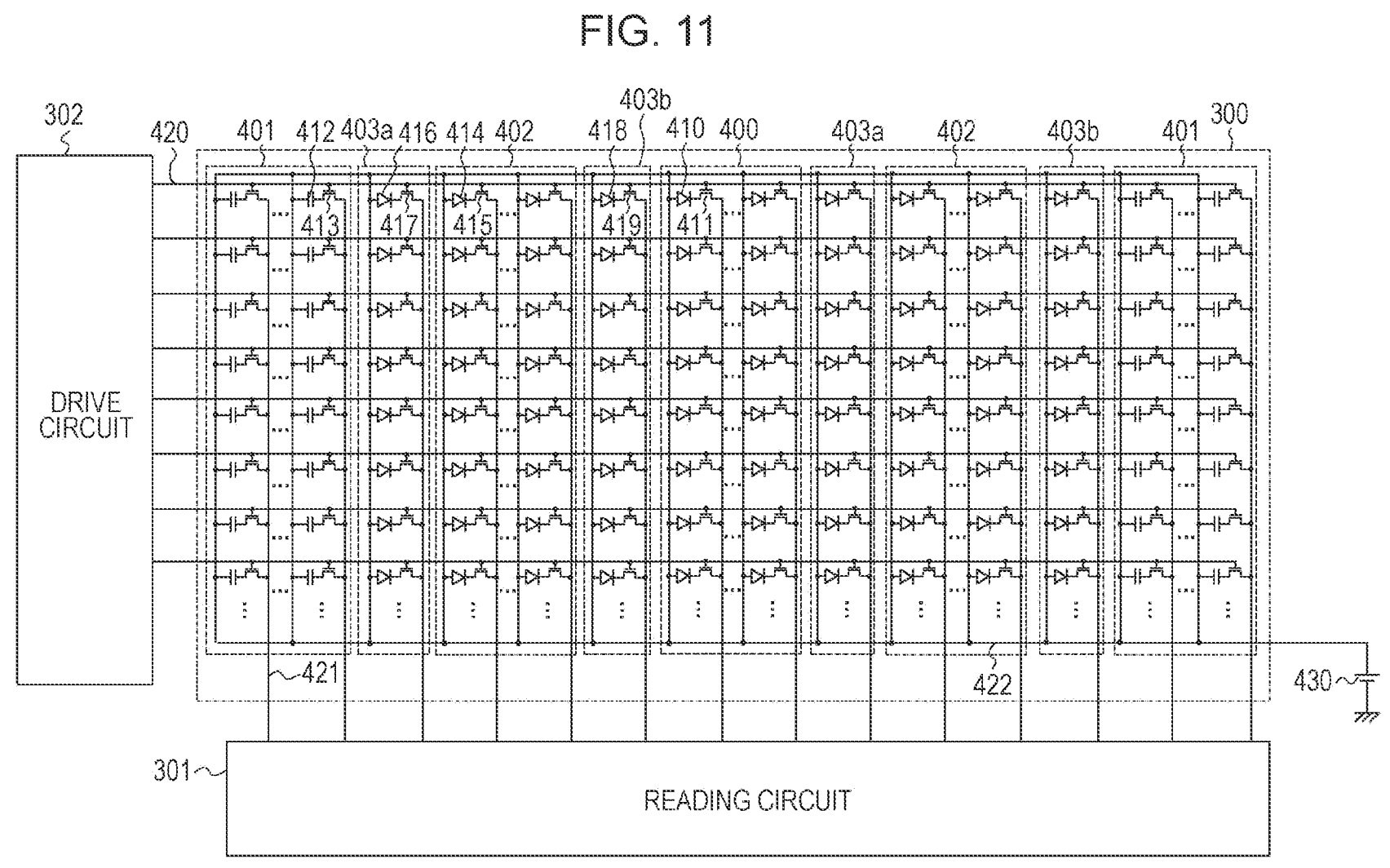

As illustrated in FIG. 11, the sensor substrate 300 may have the effective pixel region 400, the line noise correction pixel region 401, the light-shielded pixel region 402, and dummy pixel regions 403a and 403b. FIG. 11 is a diagram obtained by adding the dummy pixel regions 403a and 403b to FIG. 8. The dummy pixel region 403a includes a plurality of dummy pixels, and each of the plurality of dummy pixels includes one photoelectric conversion element 416 and one TFT 417. The dummy pixel region 403b includes a plurality of dummy pixels, and each of the plurality of dummy pixels includes one photoelectric conversion element 418 and one TFT 419. The photoelectric conversion elements 416 and 418 are similar to the photoelectric conversion element 410. The TFTs 417 and 419 are similar to the TFT 411. To the right of the dummy pixel region 403a, the light-shielded pixel region 402 is disposed. To the left of the dummy pixel region 403b, the light-shielded pixel region 402 is disposed. The dummy pixel region 403a or 403b is provided between the line noise correction pixel region 401 and the light-shielded pixel region 402. The dummy pixel region 403a or 403b is also provided between the effective pixel region 400 and the light-shielded pixel region 402.

Figures 12A, 12B:
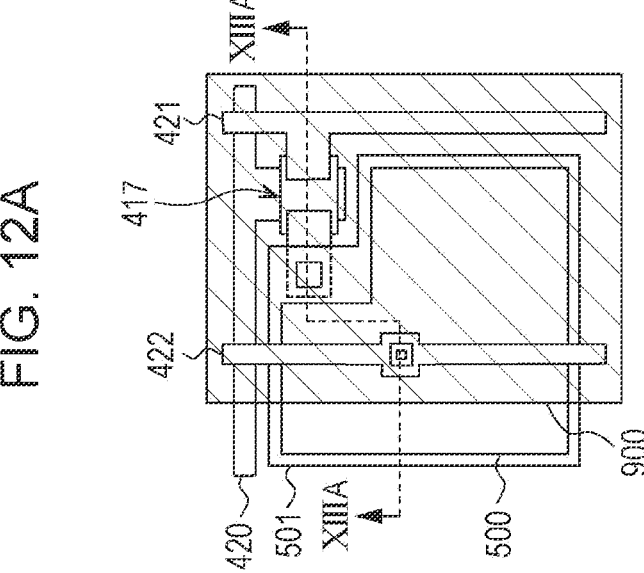
FIGS. 12A and 12B are plan views of pixels of the X-ray detector.

FIG. 12A is a plan view of one dummy pixel in the dummy pixel region 403a in FIG. 11. This dummy pixel includes the photoelectric conversion element 416 and the TFT 417. The photoelectric conversion element 416 includes the upper electrode 500 and the lower electrode 501. FIG. 12A is a diagram obtained by adding the light-shielding layer 900 to FIG. 5A. As in FIG. 9, for the light-shielding layer 900, for example, the bias line 422 can be used as a light-shielding layer. The light-shielding layer 900 in FIG. 12A is an extension of the light-shielding layer 900 of the light-shielded pixel region 402 in FIG. 9, which is to the right thereof, and is provided in the right end portion of the light-shielded pixel.

FIG. 12B is a plan view of one dummy pixel in the dummy pixel region 403b in FIG. 11. This dummy pixel includes the photoelectric conversion element 418 and the TFT 419. The photoelectric conversion element 418 includes the upper electrode 500 and the lower electrode 501. FIG. 12B is a diagram obtained by adding the light-shielding layer 900 to FIG. 5A. As in FIG. 9, for the light-shielding layer 900, for example, the bias line 422 can be used as a light-shielding layer. The light-shielding layer 900 in FIG. 12B is an extension of the light-shielding layer 900 of the light-shielded pixel region 402 in FIG. 9, which is to the left thereof, and is provided in the left end portion of the light-shielded pixel.

Figures 13A, 13B:
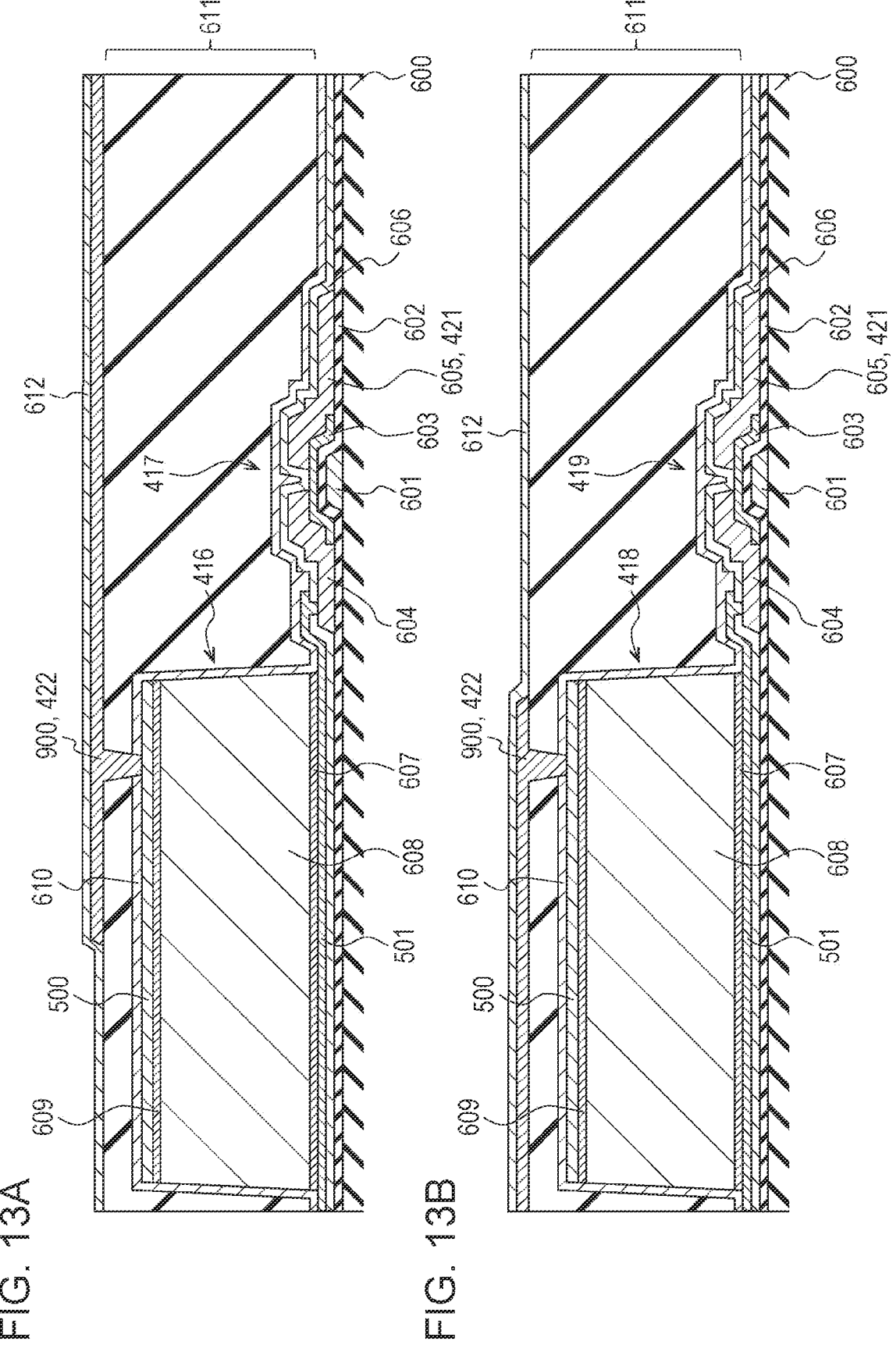
FIGS. 13A and 13B are cross-sectional views of the pixels of the X-ray detector.

FIG. 13A is a cross-sectional view of the dummy pixel in FIG. 12A taken along line XIIIA-XIIIA. This dummy pixel includes the photoelectric conversion element 416 and the TFT 417. The structure of the dummy pixel in FIG. 13A is similar to the structure of the light-shielded pixel in FIG. 10. However, the right end portion of the dummy pixel is shielded from light by the light-shielding layer 900. For the light-shielding layer 900, the bias line 422 can be used as a light-shielding layer. The light-shielding layer 900 of the dummy pixel is an extension of the light-shielding layer 900 of the light-shielded pixel to the right of the dummy pixel. This prevents the light-shielding layer 900 from being disposed over and near the effective pixel and the line noise correction pixel and accordingly reduces a decrease in the opening ratio and an increase in the parasitic capacitance of the effective pixel and an increase in the parasitic capacitance of the line noise correction pixel.

FIG. 13B is a cross-sectional view of the dummy pixel in FIG. 12B taken along line XIIIB-XIIIB This dummy pixel includes the photoelectric conversion element 418 and the TFT 419. The structure of the dummy pixel in FIG. 13B is similar to the structure of the light-shielded pixel in FIG. 10. However, the left end portion of the dummy pixel is shielded from light by the light-shielding layer 900. For the light-shielding layer 900, the bias line 422 can be used as a light-shielding layer. The light-shielding layer 900 of the dummy pixel is an extension of the light-shielding layer 900 of the light-shielded pixel to the left of the dummy pixel. This prevents the light-shielding layer 900 from being disposed over and near the effective pixel and the line noise correction pixel and accordingly reduces a decrease in the opening ratio and an increase in the parasitic capacitance of the effective pixel and an increase in the parasitic capacitance of the line noise correction pixel.

As described above, the light-shielded pixel region 402 includes light-shielded pixels that are shielded from light. The light-shielded pixel includes the photoelectric conversion element 414 and the TFT 415. At least a portion of the photoelectric conversion element 414 is shielded from light. A region that is shielded from light in the light-shielded pixel is larger than a region that is shielded from light in the effective pixel. The control arithmetic unit 304 corrects signals of effective pixels by using signals of line noise correction pixels and signals of light-shielded pixels.

The structure of the photoelectric conversion element 410 and the structure of the photoelectric conversion element 414 are approximately equivalent to each other. The structure of The TFT 411 and the structure of the TFT 415 are approximately equivalent to each other. The dark current generated in the photoelectric conversion element 410 and the dark current generated in the photoelectric conversion element 414 are approximately equivalent to each other. The dark current generated in the TFT 411 and the dark current generated in the TFT 415 are approximately equivalent to each other.

In FIG. 8, the effective pixel and the light-shielded pixel are adjacent to each other. In FIG. 11, the dummy pixel region 403a includes dummy pixels each including the photoelectric conversion element 416 and the TFT 417. The dummy pixel region 403b includes dummy pixels each including the photoelectric conversion element 418 and the TFT 419. The dummy pixel is disposed between the effective pixel and the light-shielded pixel or between the line noise correction pixel and the light-shielded pixel. As illustrated in FIGS. 12A and 12B, a portion, of the dummy pixel, adjacent to the light-shielded pixel is shielded from light by the light-shielding layer 900, and a portion, of the dummy pixel, adjacent to the effective pixel or the line noise correction pixel is not shielded from light.

The dummy pixel in the dummy pixel region 403a is disposed between the line noise correction pixel in the line noise correction pixel region 401 and the light-shielded pixel in the light-shielded pixel region 402 or between the effective pixel in the effective pixel region 400 and the light-shielded pixel in the light-shielded pixel region 402.

The dummy pixel in the dummy pixel region 403b is also disposed between the effective pixel in the effective pixel region 400 and the light-shielded pixel in the light-shielded pixel region 402 or between the line noise correction pixel in the line noise correction pixel region 401 and the light-shielded pixel in the light-shielded pixel region 402.

As illustrated in FIGS. 12A and 12B, a portion, of the dummy pixel, adjacent to the light-shielded pixel is shielded from light, and a portion, of the dummy pixel, adjacent to the effective pixel is not shielded from light. A portion, of the dummy pixel, adjacent to the light-shielded pixel is shielded from light, and a portion, of the dummy pixel, adjacent to the line noise correction pixel is not shielded from light. The control arithmetic unit 304 corrects signals of effective pixels by using signals of line noise correction pixels and signals of light-shielded pixels.

In FIG. 11, the signal line 421 for the effective pixel region 400 is a signal line for reading signals from the effective pixels. The signal line 421 for the line noise correction pixel region 401 is a signal line for reading signals from the line noise correction pixels. The signal line 421 for the light-shielded pixel region 402 is a signal line for reading signals from the light-shielded pixels. The signal line 421 for the dummy pixel regions 403a and 403b is a signal line for reading signals from the dummy pixels.

According to this embodiment, the X-ray inspection apparatus 100 can correct line noise generated in the effective pixels by using the line noise correction pixels, the light-shielded pixels, and the dummy pixels, with high accuracy.

Third Embodiment

A third embodiment will now be described. The third embodiment is different from the first and second embodiments in the following two points. The signal line 421 for the effective pixel region 400, the line noise correction pixel region 401, and the dummy pixel region 403b is formed of a metal layer that is the uppermost layer, and the gate electrode 601 and the drive line 420 are formed in different layers. The signal line 421 is formed of the metal layer that is the uppermost layer to thereby attain a decrease in parasitic capacitances related to the signal line 421 and reduce noise. The gate electrode 601 and the drive line 420 are formed in different layers to thereby allow the gate electrode 601 and the drive line 420 to be formed of different types of metal. For example, the gate electrode 601 can be formed of metal of high specific resistance and high heat resistance, and the drive line 420 can be formed of metal of low heat resistance and low specific resistance. This can increase the process temperature of the TFTs and improve the electrical characteristics and stability of the TFTs while the resistance of the drive line 420 is kept low.

The differences of the third embodiment from the first and second embodiments will be described below. The third embodiment is different from the first and second embodiments in terms of the layer configurations of the effective pixel region 400, the line noise correction pixel region 401, the dummy pixel region 403a, and the dummy pixel region 403b.

Figures 14A, 14B, 14C, 14D:
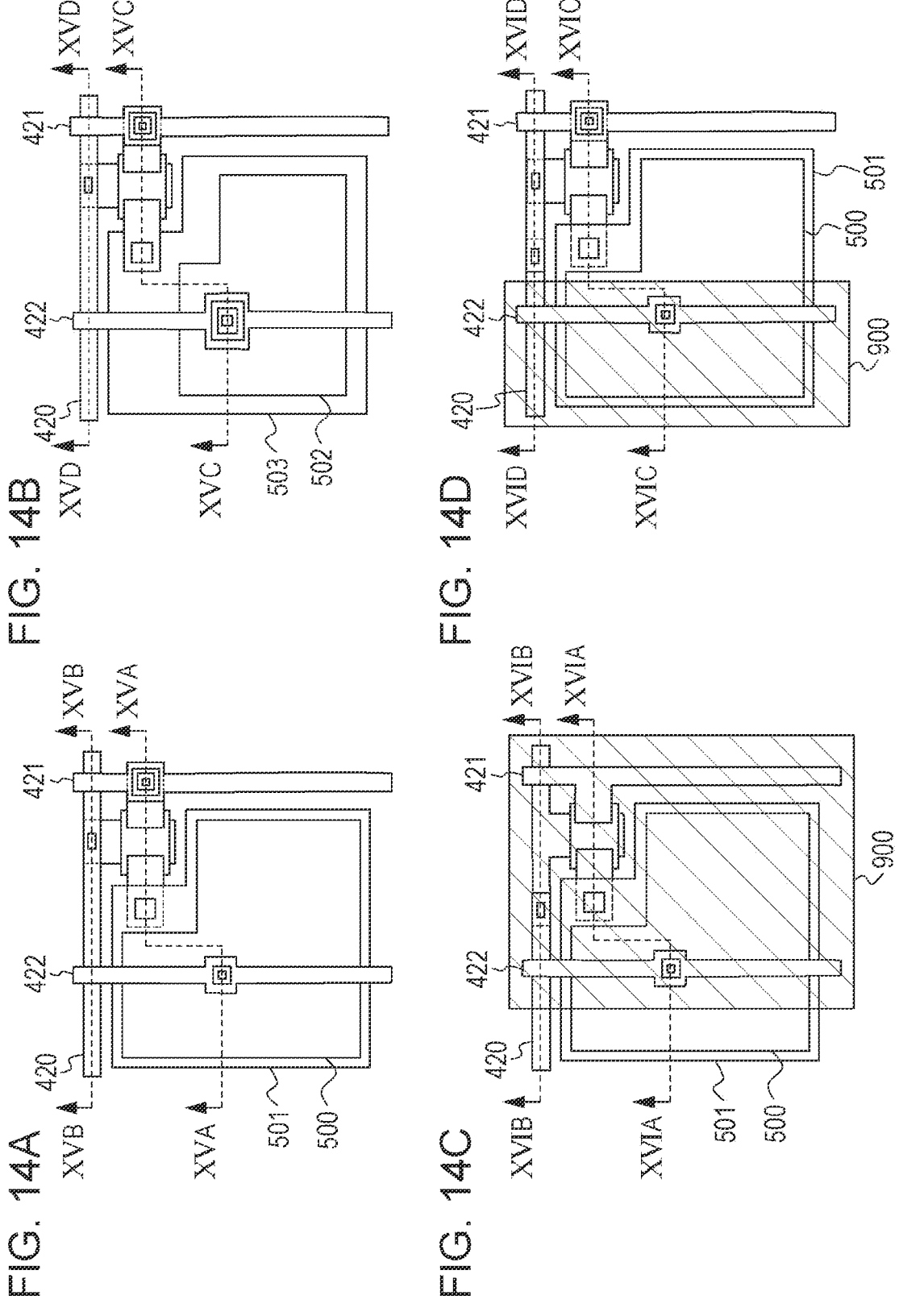
FIGS. 14A to 14D are plan views of pixels of the X-ray detector.
Figure 15A:
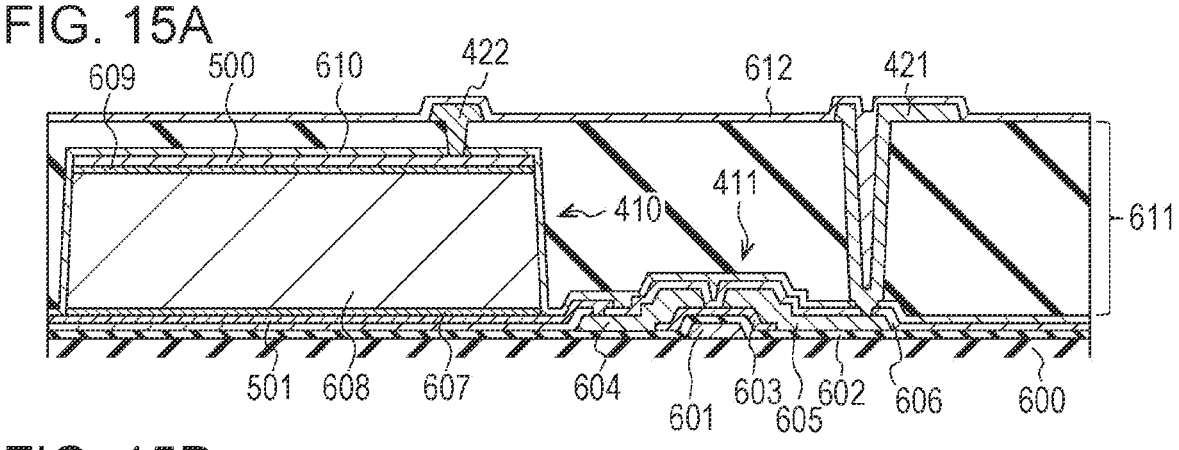
FIGS. 15A to 15D are cross-sectional views of the pixels of the X-ray detector.
Figure 15B:
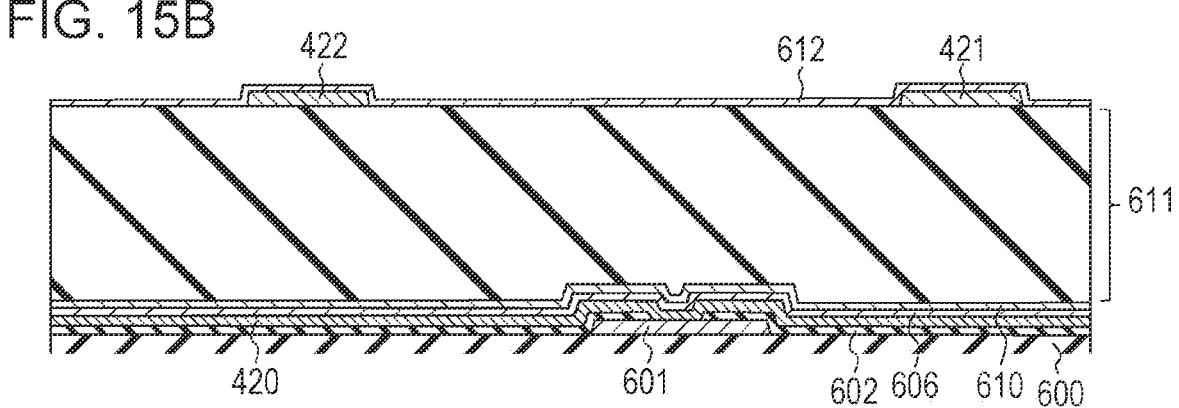

FIG. 14A is a plan view of the effective pixel in the effective pixel region 400, FIG. 15A is a cross-sectional view taken along line XVA-XVA in FIG. 14A, and FIG. 15B is a cross-sectional view taken along line XVB-XVB in FIG. 14A. The signal line 421 is formed of the metal layer that is the uppermost layer. The gate electrode 601 and the drive line 420 are formed in different layers. The signal line 421 is formed by using the same metal layer of the bias line 422 and is connected to the drain electrode 605 of the TFT 411 through a contact hole. The drive line 420 is formed by using the same layer metal of the drain electrode 605 of the TFT 411 and is connected to the gate electrode 601 of the TFT 411 through a contact hole.

Figure 15C:
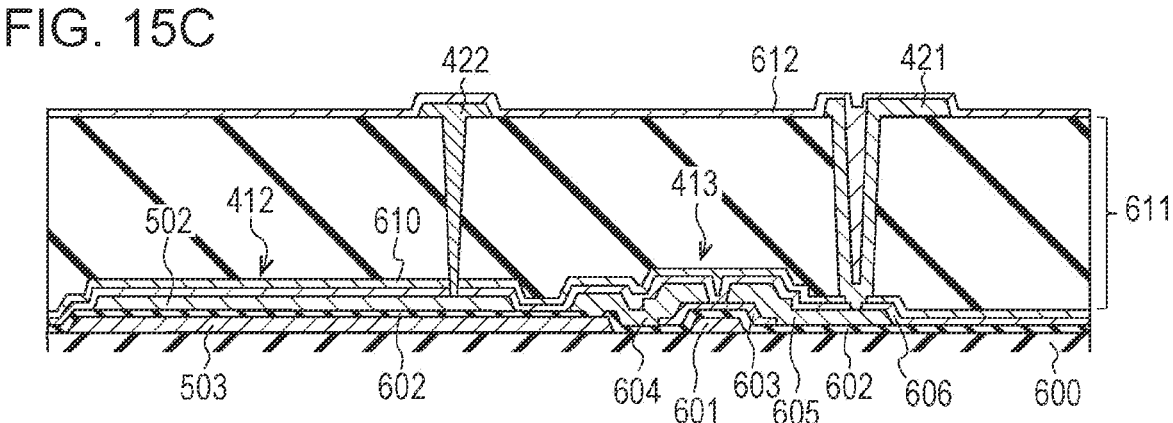
Figure 15D:
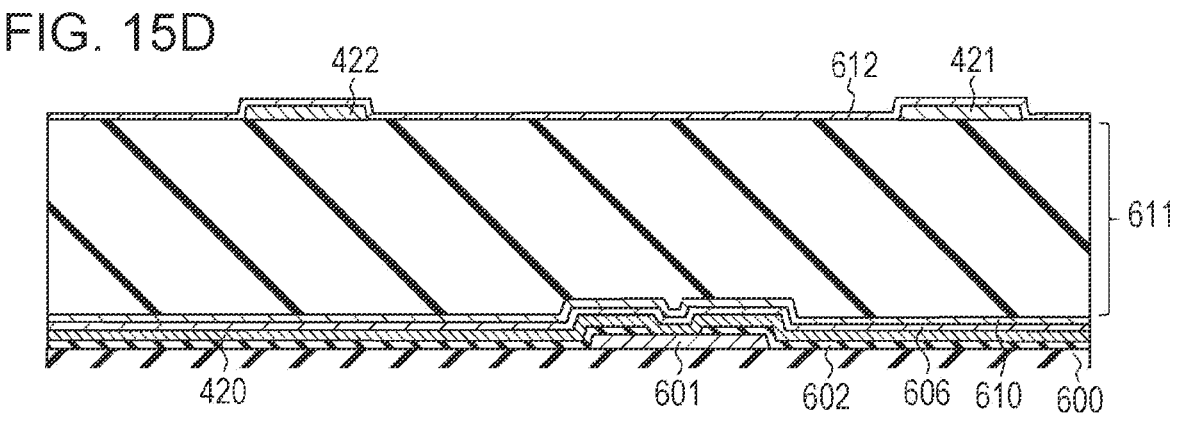

FIG. 14B is a plan view of the line noise correction pixel in the line noise correction pixel region 401, FIG. 15C is a cross-sectional view taken along line XVC-XVC in FIG. 14B, and FIG. 15D is a cross-sectional view taken along line XVD-XVD in FIG. 14B. The signal line 421 is formed of the metal layer that is the uppermost layer. The gate electrode 601 and the drive line 420 are formed in different layers. The signal line 421 is formed by using the same metal layer of the bias line 422 and is connected to the drain electrode 605 of the TFT 413 through a contact hole. The drive line 420 is formed by using the same layer metal of the drain electrode 605 of the TFT 413 and is connected to the gate electrode 601 of the TFT 413 through a contact hole.

FIG. 14C is a plan view of the dummy pixel in the dummy pixel region 403a, FIG. 16A is a cross-sectional view taken along line XVIA-XVIA in FIG. 14C, and FIG. 16B is a cross-sectional view taken along line XVIB-XVIB in FIG. 14C. The drive line 420 is formed by using two metal layers, namely, a metal layer in the same layer in which the gate electrode 601 is disposed and a metal layer in the same layer in which the drain electrode 605 is disposed, which are connected through a contact hole. Furthermore, the drive line 420 is connected to the gate electrode 601 of the TFT 419 through a contact hole.

FIG. 14D is a plan view of the dummy pixel in the dummy pixel region 403*b*, FIG. 16C is a cross-sectional view taken along line XVIC-XVIC in FIG. 14D, and FIG. 16D is a cross-sectional view taken along line XVID-XVID in FIG. 14D. The signal line 421 is formed of the metal layer that is the uppermost layer. The signal line 421 is formed by using a metal layer in the same layer in which the bias line 422 is disposed, and is connected to the drain electrode 605 of the TFT 419 through a contact hole. The drive line 420 is formed by using two metal layers, namely, a metal layer in the same layer in which the gate electrode 601 is disposed and a metal layer in the same layer in which the drain electrode 605 is disposed, which are connected through a contact hole. Furthermore, the drive line 420 is connected to the gate electrode 601 of the TFT 419 through a contact hole.

The layer configurations described above can prevent a short circuit between the light-shielding layer 900 and the signal line 421 and allow the drive line 420 formed of different metal layers to be connected.

As described above, in the effective pixel in FIGS. 15A and 15B, the drive line 420 is the gate line of the TFT 411 and is formed of a material different from that of the gate electrode 601 of the TFT 411.

In the line noise correction pixel in FIGS. 15C and 15D, the drive line 420 is the gate line of the TFT 413 and is formed of a material different from that of the gate electrode 601 of the TFT 413. In the dummy pixel in FIGS. 16A and 16B, the drive line 420 is the gate line of the TFT 417, and a portion of the drive line 420 is formed of a material different from that of the gate electrode 601 of the TFT 417 while the remaining portion thereof is formed of a material the same as that of the gate electrode 601 of the TFT 417. In the dummy pixel in FIGS. 16C and 16D, the drive line 420 is the gate line of the TFT 419, and a portion of the drive line 420 is formed of a material different from that of the gate electrode 601 of the TFT 419 while the remaining portion thereof is formed of a material the same as that of the gate electrode 601 of the TFT 419. In the light-shielded pixel in FIG. 9 and FIG. 10, the drive line 420 is the gate line of the TFT 415 and is formed of a material the same as that of the gate electrode 601 of the TFT 415.

The signal line 421 for the effective pixel region 400 is a signal line for reading signals from the effective pixels. The signal line 421 for the line noise correction pixel region 401 is a signal line for reading signals from the line noise correction pixels. The signal line 421 for the light-shielded pixel region 402 is a signal line for reading signals from the light-shielded pixels. The signal line 421 for the dummy pixel regions 403*a* and 403*b* is a signal line for reading signals from the dummy pixels.

The signal line 421 of the light-shielded pixel is formed in a first layer as in FIG. 16B. The signal line 421 of the effective pixel in FIG. 15B and the signal line 421 of the line noise correction pixel in FIG. 15D are formed in a layer above the first layer described above, (for example, in the uppermost layer that is the metal layer). When the signal line 421 of the dummy pixel is shielded from light by the light-shielding layer 900 as in FIG. 16B, the signal line 421 of the dummy pixel is formed in the first layer described above. When the signal line 421 of the dummy pixel is not shielded from light as in FIG. 16D, the signal line 421 of the dummy pixel is formed in a layer above the first layer described above (for example, in the uppermost layer that is the metal layer).

The embodiments described above are only specific examples for embodying the present disclosure, and the technical scope of the present disclosure is not to be limitedly construed by the embodiments. In other words, the present disclosure can be embodied in various forms without departing from the spirit or main features thereof.

The disclosure of the embodiments includes the following configurations and method.

Configuration 1

A radiation imaging apparatus including:
a first pixel that includes a first photoelectric conversion element and a first thin-film transistor and is used in image acquisition;
a second pixel that includes a capacitive element and a second thin-film transistor; and
a correction unit configured to correct a signal of the first pixel by using a signal of the second pixel.

Configuration 2

The radiation imaging apparatus according to configuration 1, further including:
a first signal line for reading the signal from the first pixel; and
a second signal line for reading the signal from the second pixel, in which
a ratio between a plurality of parasitic capacitances related to the first signal line and a ratio between a plurality of parasitic capacitances related to the second signal line are approximately equivalent to each other.

Configuration 3

The radiation imaging apparatus according to configuration 1 or 2, in which a structure of the first thin-film transistor and a structure of the second thin-film transistor are approximately equivalent to each other.

Configuration 4

The radiation imaging apparatus according to any one of configurations 1 to 3, in which a plurality of pixels including the first pixel and the second pixel are arranged in a matrix, and
the second pixel is disposed in the same row or in the same column in which the first pixel is disposed.

Configuration 5

The radiation imaging apparatus according to any one of configurations 1 to 4, in which the capacitive element is formed by using a gate insulating film of the second thin-film transistor.

Configuration 6

The radiation imaging apparatus according to any one of configurations 1 to 5, in which a parasitic resistance of a line of the first pixel and a parasitic resistance of a line of the second pixel are approximately equivalent to each other.

Configuration 7

The radiation imaging apparatus according to any one of configurations 1 to 6, further including: a third pixel that includes a second photoelectric conversion element and a third thin-film transistor, at least a portion of the second photoelectric conversion element being shielded from light, in which
a region that is shielded from light in the third pixel is larger than a region that is shielded from light in the first pixel, and
the correction unit is configured to correct the signal of the first pixel by using the signal of the second pixel and a signal of the third pixel.

Configuration 8

The radiation imaging apparatus according to configuration 7, in which a dark current generated in the first photoelectric conversion element and a dark current generated in the second photoelectric conversion element are approximately equivalent to each other, and a dark current generated in the first thin-film transistor and a dark current generated in the third thin-film transistor are approximately equivalent to each other.

Configuration 9

The radiation imaging apparatus according to configuration 7 or 8, in which the first pixel and the third pixel are adjacent to each other.

Configuration 10

The radiation imaging apparatus according to any one of configurations 7 to 9, further including: a fourth pixel that is disposed between the first pixel and the third pixel or between the second pixel and the third pixel and includes a third photoelectric conversion element and a fourth thin-film transistor, in which a portion, of the fourth pixel, adjacent to the third pixel is shielded from light and a portion, of the fourth pixel, adjacent to the first pixel or the second pixel is not shielded from light.

Configuration 11

The radiation imaging apparatus according to configuration 10, in which a gate line of the first thin-film transistor is formed of a material different from a material of a gate electrode of the first thin-film transistor, a gate line of the second thin-film transistor is formed of a material different from a material of a gate electrode of the second thin-film transistor, a gate line of the third thin-film transistor is formed of a material the same as a material of a gate electrode of the third thin-film transistor, and a portion of a gate line of the fourth thin-film transistor is formed of a material different from a material of a gate electrode of the fourth thin-film transistor and a remaining portion thereof is formed of a material the same as the material of the gate electrode of the fourth thin-film transistor.

Configuration 12

The radiation imaging apparatus according to any one of configurations 7 to 11, in which a structure of the first photoelectric conversion element and a structure of the second photoelectric conversion element are approximately equivalent to each other, and a structure of the first thin-film transistor and a structure of the third thin-film transistor are approximately equivalent to each other.

Configuration 13

The radiation imaging apparatus according to configuration 10 or 11, further including:

a first signal line for reading a signal from the first pixel;

a second signal line for reading a signal from the second pixel;

a third signal line for reading a signal from the third pixel; and a fourth signal line for reading a signal from the fourth pixel, in which the third signal line is formed in a first layer, the first signal line and the second signal line are formed in a layer above the first layer, and when the fourth signal line is shielded from light, the fourth signal line is formed in the first layer, and when the fourth signal line is not shielded from light, the fourth signal line is formed in the layer above the first layer.

Configuration 14

The radiation imaging apparatus according to configuration 13, in which the first signal line and the second signal line are formed in an uppermost layer that is a metal layer, and when the fourth signal line is not shielded from light, the fourth signal line is formed in the uppermost layer that is the metal layer.

Configuration 15

The radiation imaging apparatus according to any one of configurations 1 to 6, further including:

a third pixel that includes a second photoelectric conversion element and a third thin-film transistor and is shielded from light;

a fourth pixel that includes a third photoelectric conversion element and a fourth thin-film transistor and is shielded from light;

a fifth pixel that is disposed between the first pixel and the third pixel and includes a fourth photoelectric conversion element and a fifth thin-film transistor; and a sixth pixel that is disposed between the second pixel and the fourth pixel and includes a fifth photoelectric conversion element and a sixth thin-film transistor, in which a portion, of the fifth pixel, adjacent to the third pixel is shielded from light and a portion, of the fifth pixel, adjacent to the first pixel is not shielded from light, a portion, of the sixth pixel, adjacent to the fourth pixel is shielded from light and a portion, of the sixth pixel, adjacent to the second pixel is not shielded from light, and the correction unit is configured to correct the signal of the first pixel by using the signal of the second pixel, a signal of the third pixel, and a signal of the fourth pixel.

Configuration 16

The radiation imaging apparatus according to configuration 15, further including:

a first signal line for reading a signal from the first pixel;

a second signal line for reading a signal from the second pixel;

a third signal line for reading a signal from the third pixel;

a fourth signal line for reading a signal from the fourth pixel;

a fifth signal line for reading a signal from the fifth pixel; and a sixth signal line for reading a signal from the sixth pixel, in which the third signal line and the fourth signal line are formed in a first layer, the first signal line and the second signal line are formed in a layer above the first layer, and one of the fifth signal line and the sixth signal line is formed in the first layer and the other of the fifth signal line and the sixth signal line is formed in the layer above the first layer.

Configuration 17

The radiation imaging apparatus according to configuration 16, in which the first signal line and the second signal line are formed in an uppermost layer that is a metal layer, and the other of the fifth signal line and the sixth signal line is formed in the uppermost layer that is the metal layer.

Configuration 18

The radiation imaging apparatus according to any one of configurations 15 to 17, in which a gate line of the first thin-film transistor is formed of a material different from a material of a gate electrode of the first thin-film transistor, a gate line of the second thin-film transistor is formed of a material different from a material of a gate electrode of the second thin-film transistor, a gate line of the third thin-film transistor is formed of a material the same as a material of a gate electrode of the third thin-film transistor, a gate line of the fourth thin-film transistor is formed of a material the same as a material of a gate electrode of the fourth thin-film transistor, a portion of a gate line of the fifth thin-film transistor is formed of a material different from a material of a gate electrode of the fifth thin-film transistor and a remaining portion thereof is formed of a material the same as the material of the gate electrode of the fifth thin-film transistor, and a portion of a gate line of the sixth thin-film transistor is formed of a material different from a material of a gate electrode of the sixth thin-film transistor and a remaining portion thereof is formed of a material the same as the material of the gate electrode of the sixth thin-film transistor.

Method 1

A control method for a radiation imaging apparatus including:

a first pixel that includes a first photoelectric conversion element and a first thin-film transistor and is used in image acquisition; and a second pixel that includes a capacitive element and a second thin-film transistor, the control method including:

a correction step of correcting a signal of the first pixel by using a signal of the second pixel.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-169667, filed Oct. 24, 2022, which is hereby incorporated by reference herein in its entirety.

What is claimed is:

1. An apparatus comprising:

a first pixel for acquiring an image, the first pixel including a first conversion element and a first thin-film transistor and connected to a first signal line; and a second pixel including an electrostatic capacitive element and a second thin-film transistor, the second pixel being a line noise correction pixel disposed in the same row as the first pixel and connected to a second signal line, wherein the first conversion element performs photoelectric conversion and has a capacitance, wherein the electrostatic capacitive element has a capacitance and does not perform photoelectric conversion, and wherein ratios of parasitic capacitances related to the first and second signal lines are approximately equivalent within ±30%.

2. The apparatus according to claim 1, wherein a structure of the first thin-film transistor and a structure of the second thin-film transistor are equivalent.

3. The apparatus according to claim 1, wherein the electrostatic capacitive element is formed by using at least two metal layers and at least one insulating layer.

4. The apparatus according to claim 1, wherein the electrostatic capacitive element is formed by using a gate insulating film of the second thin-film transistor.

5. The apparatus according to claim 1, wherein a resistance of a line of the first pixel and a resistance of a line of the second pixel are equivalent.

6. The apparatus according to claim 1, further comprising:

a third pixel that includes a second conversion element and a third thin-film transistor, a portion of the second conversion element being shielded from light, wherein a region that is shielded from light in the third pixel is larger than a region that is shielded from light in the first pixel, and a signal of the first pixel is corrected based on a signal of the second pixel and a signal of the third pixel.

7. The apparatus according to claim 6, wherein a dark current generated in the first conversion element and a dark current generated in the second conversion element are equivalent, and a dark current generated in the first thin-film transistor and a dark current generated in the third thin-film transistor are equivalent.

8. The apparatus according to claim 6, wherein the first pixel and the third pixel are adjacent to each other.

9. The apparatus according to claim 6, further comprising:

a fourth pixel that includes a third conversion element and a fourth thin-film transistor and is disposed between the first pixel and the third pixel or between the second pixel and the third pixel, wherein a portion, of the fourth pixel, adjacent to the third pixel is shielded from light, and a portion, of the fourth pixel, adjacent to the first pixel or the second pixel is not shielded from light.

10. The apparatus according to claim 9, wherein a gate line of the first thin-film transistor is formed of a material different from a material of a gate electrode of the first thin-film transistor, a gate line of the second thin-film transistor is formed of a material different from a material of a gate electrode of the second thin-film transistor, a gate line of the third thin-film transistor is formed of a material the same as a material of a gate electrode of the third thin-film transistor, and a portion of a gate line of the fourth thin-film transistor is formed of a material different from a material of a gate electrode of the fourth thin-film transistor and a remaining portion thereof is formed of a material the same as the material of the gate electrode of the fourth thin-film transistor.

11. The apparatus according to claim 9, wherein a structure of the first conversion element and a structure of the second conversion element are equivalent, and a structure of the first thin-film transistor and a structure of the third thin-film transistor are equivalent.

12. The apparatus according to claim 9, further comprising:

a third signal line for reading a signal from the third pixel; and a fourth signal line for reading a signal from the fourth pixel, wherein the third signal line is formed in a first layer, the first signal line and the second signal line are formed in a layer above the first layer, and the fourth signal line has a structure so as to be shielded from light and formed in the first layer or has a structure so as not to be shielded from light and formed in the layer above the first layer.

13. The apparatus according to claim 12, wherein the first signal line and the second signal line are formed in an uppermost layer that is a metal layer, and a region, of the fourth signal line, not shielded from light is formed in the uppermost layer that is the metal layer.

14. The apparatus according to claim 1, further comprising:

a third pixel that includes a second conversion element and a third thin-film transistor and is shielded from light;

a fourth pixel that includes a third conversion element and a fourth thin-film transistor and is shielded from light;

a fifth pixel that is disposed between the first pixel and the third pixel and includes a fourth conversion element and a fifth thin-film transistor; and a sixth pixel that is disposed between the second pixel and the fourth pixel and includes a fifth conversion element and a sixth thin-film transistor, wherein a portion, of the fifth pixel, adjacent to the third pixel is shielded from light and a portion, of the fifth pixel, adjacent to the first pixel is not shielded from light, a portion, of the sixth pixel, adjacent to the fourth pixel is shielded from light and a portion, of the sixth pixel, adjacent to the second pixel is not shielded from light, and a signal of the first pixel is corrected on the basis of a signal of the second pixel, a signal of the third pixel, and a signal of the fourth pixel.

15. The apparatus according to claim 14, further comprising:

a third signal line for reading a signal from the third pixel;

a fourth signal line for reading a signal from the fourth pixel;

a fifth signal line for reading a signal from the fifth pixel; and a sixth signal line for reading a signal from the sixth pixel, wherein the third signal line and the fourth signal line are formed in a first layer, the first signal line and the second signal line are formed in a layer above the first layer, and one of the fifth signal line and the sixth signal line is formed in the first layer, and the other of the fifth signal line and the sixth signal line is formed in the layer above the first layer.

16. The apparatus according to claim 15, wherein the first signal line and the second signal line are formed in an uppermost layer that is a metal layer, and the other of the fifth signal line and the sixth signal line is formed in the uppermost layer that is the metal layer.

17. The apparatus according to claim 15, wherein a gate line of the first thin-film transistor is formed of a material different from a material of a gate electrode of the first thin-film transistor, a gate line of the second thin-film transistor is formed of a material different from a material of a gate electrode of the second thin-film transistor, a gate line of the third thin-film transistor is formed of a material the same as a material of a gate electrode of the third thin-film transistor, a gate line of the fourth thin-film transistor is formed of a material the same as a material of a gate electrode of the fourth thin-film transistor, a portion of a gate line of the fifth thin-film transistor is formed of a material different from a material of a gate electrode of the fifth thin-film transistor and a remaining portion thereof is formed of a material the same as the material of the gate electrode of the fifth thin-film transistor, and a portion of a gate line of the sixth thin-film transistor is formed of a material different from a material of a gate electrode of the sixth thin-film transistor and a remaining portion thereof is formed of a material the same as the material of the gate electrode of the sixth thin-film transistor.

18. A control method for controlling an apparatus including: a first pixel for acquiring an image, the first pixel including a first conversion element and a first thin-film transistor and connected to a first signal line; and a second pixel including an electrostatic capacitive element and a second thin-film transistor, the second pixel being a line noise correction pixel disposed in the same row as the first pixel and connected to a second signal line, the control method comprising:

correcting a signal acquired from the first signal line by using a signal acquired from the second signal line, wherein the first conversion element performs photoelectric conversion and has a capacitance, wherein the electrostatic capacitive element has a capacitance and does not perform photoelectric conversion, and wherein ratios of parasitic capacitances related to the first and second signal lines are approximately equivalent within ±30%.

19. The method according to claim 18, wherein a structure of the first thin-film transistor and a structure of the second thin-film transistor are equivalent.

20. The method according to claim 18, wherein the electrostatic capacitive element is formed by using at least two metal layers and at least one insulating layer.

* * * * *